US012622101B2

(12) United States Patent
Yoo et al.

(10) Patent No.: US 12,622,101 B2
(45) Date of Patent: May 5, 2026

(54) LIGHT EMITTING DIODE HAVING IMPROVED HOLE INJECTION STRUCTURE

(71) Applicant: SEOUL VIOSYS CO., LTD., Ansan-si (KR)

(72) Inventors: HongJae Yoo, Ansan-si (KR); SungRyong Cho, Ansan-si (KR); Miso Ko, Ansan-si (KR); Eunmi Choi, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 568 days.

(21) Appl. No.: 18/163,684

(22) Filed: Feb. 2, 2023

(65) Prior Publication Data

US 2023/0282764 A1    Sep. 7, 2023

Related U.S. Application Data

(60) Provisional application No. 63/307,516, filed on Feb. 7, 2022.

(51) Int. Cl.
*H10H 20/81*        (2025.01)
*H10H 20/816*       (2025.01)
*H10H 20/824*       (2025.01)

(52) U.S. Cl.
CPC .... *H10H 20/8215* (2025.01); *H10H 20/8162* (2025.01); *H10H 20/8242* (2025.01)

(58) Field of Classification Search
CPC .......... H10H 20/8215; H10H 20/8162; H10H 20/8242
See application file for complete search history.

(56) References Cited

U.S. PATENT DOCUMENTS

2008/0150085 A1*  6/2008  Dadgar ............. H01L 21/02639
                                                    257/E29.093
2014/0183590 A1   7/2014  Kim et al.
2018/0019371 A1   1/2018  Steckle et al.
2018/0138362 A1*  5/2018  Kim ...................... H10H 20/82
                          (Continued)

FOREIGN PATENT DOCUMENTS

CN          104966768 B      5/2017
KR    10-2014-0120681 A     10/2014
KR    10-2018-0076695 A      7/2018
                 (Continued)

OTHER PUBLICATIONS

S.E. Bennett, R.M. Ulfig, P.H. Clifton, M.J. Kappers, J.S. Barnard, C.J. Humphreys, R.A. Oliver, Atom probe tomography and transmission electron microscopy of a Mg-doped AlGaN/GaN superlattice, Ultramicroscopy, vol. 111, Issue 3, 2011, pp. 207-211 (Year: 2011).*
                       (Continued)

*Primary Examiner* — Mark W Tornow
(74) *Attorney, Agent, or Firm* — Perkins Coie LLP

(57)        ABSTRACT

A light emitting device according to an embodiment of the present disclosure includes a first conductivity type semiconductor region; a second conductivity type semiconductor region; and a light emitting region disposed between the first conductivity type semiconductor region and the second conductivity type semiconductor region, in which the second conductivity type semiconductor region includes a plurality of regions including Mg balls.

18 Claims, 21 Drawing Sheets

(56)                    References Cited

U.S. PATENT DOCUMENTS

2018/0351039 A1 *  12/2018  Kim ................... H10H 20/8252
2019/0348567 A1 *  11/2019  Na ....................... H10D 86/421

FOREIGN PATENT DOCUMENTS

| KR | 20180076695 A   | 7/2018  |
|----|-----------------|---------|
| KR | 10-2160068 B1   | 9/2020  |
| KR | 10-2306758 B1   | 10/2021 |
| KR | 2014-0120681 A  | 8/2024  |

OTHER PUBLICATIONS

English translation of the International Search Report from PCT/KR2023/001734 dated May 23, 2023.
European Search Report from European Patent Application No. 23750016, dated Dec. 2, 2025.

* cited by examiner

FIG. 11A
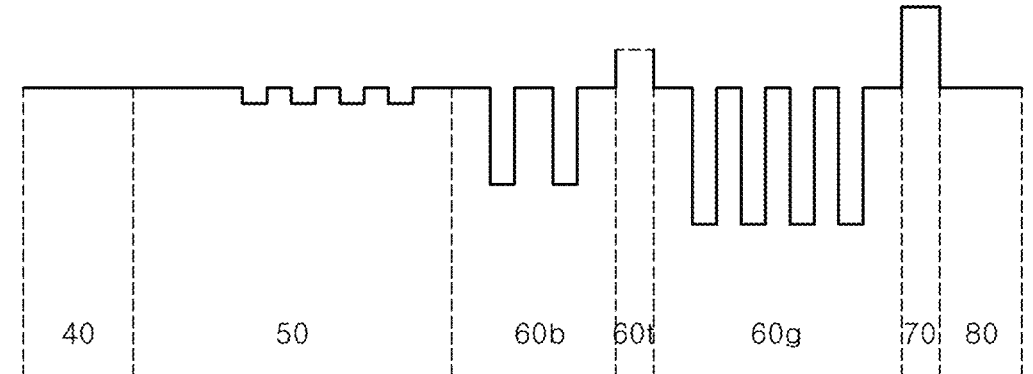
FIG. 11B
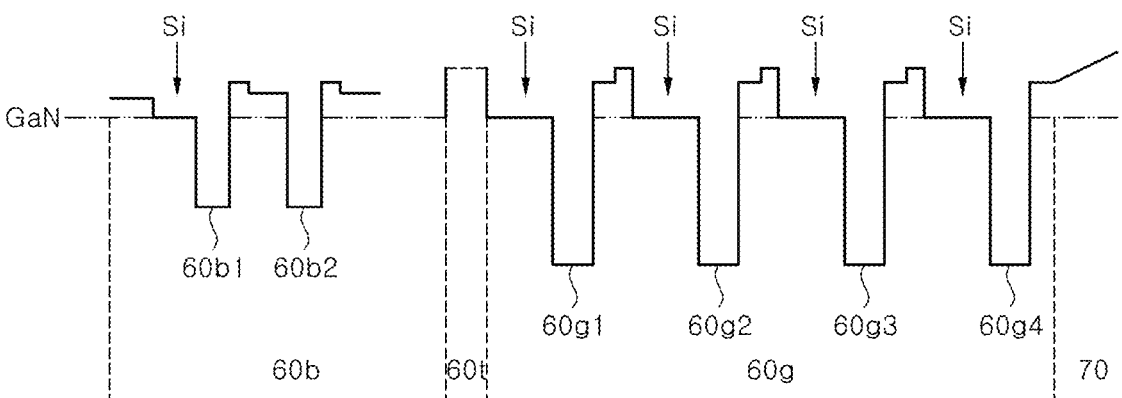
FIG. 12
85a
83
81
75
73
71

85b

LIGHT EMITTING DIODE HAVING IMPROVED HOLE INJECTION STRUCTURE

CROSS-REFERENCE TO RELATED APPLICATIONS

This application claims priority to and the benefit of U.S. Provisional Application No. 63/307,516, filed on Feb. 7, 2022, the disclosure of which is hereby incorporated by reference for all purposes as if fully set forth herein.

TECHNICAL FIELD

The present disclosure relates to a light emitting diode and, more particularly, to a light emitting diode having an improved hole injection structure.

BACKGROUND

Implementation of various colors is used in various technical fields in daily life, and for example, various colors are implemented in various technical fields such as lighting, automobiles, light therapy, and displays.

In general, since a light emitting diode emits light having a single narrow full width at half maximum, it emits light of a single color in a visible light region. In order to implement various colors, a plurality of light emitting diodes having different peak wavelengths is used, or wavelength conversion materials such as phosphors are used together with the light emitting diodes.

Meanwhile, in order to implement a white LED without a phosphor, it is necessary to include a greater number of well layers than the number of well layers constituting a conventional active layer. In this structure, carrier dynamics of electrons and holes are important such that all well layers in the active layer participate in light emission. In particular, injection of holes into the active layer has a great effect on efficiency and characteristics of the white LED, so that a more improved hole injection structure is required. Moreover, it is necessary to increase a hole injection efficiency into the active layer.

SUMMARY

Embodiments according to the present disclosure provide a light emitting diode having a hole injection structure configured to increase a hole injection efficiency into an active layer.

Embodiments according to the present disclosure may provide a module configured to be stably driven and provide a light emitting device configured to implement various colors.

Exemplary embodiments according to the present disclosure provide a light emitting device configured to improve various colors without a phosphor.

A light emitting device according to an embodiment of the present disclosure may include a first conductivity type semiconductor region; a second conductivity type semiconductor region; and a light emitting region disposed between the first conductivity type semiconductor region and the second conductivity type semiconductor region, in which the second conductivity type semiconductor region includes a plurality of regions including Mg balls.

The region where the Mg balls are formed may have an Mg doping concentration of $5E19/cm^3$ or more.

The region including the Mg balls may contain Al. A content of the Al may be 0.05 atomic % or more and 30 atomic % or less with respect to that of an entire Group 3 elements.

At least portions of the Mg balls may have a curved boundary surface.

The Mg balls may have various amorphous shapes.

The Mg balls may have different concentrations from one another.

The Mg balls may have different resistivities from one another.

The regions including the Mg balls may have different thicknesses from one another.

Among the regions including the Mg balls, a region farthest from the light emitting region may have a smaller thickness than other regions.

The plurality of regions may have different Mg ball densities from one another. The second conductivity type semiconductor region may include an electron blocking layer, a high-concentration doping layer, a low-concentration doping layer, and a contact layer, in which the Mg balls may be distributed in the electron blocking layer, the high-concentration doping layer, and the contact layer. The low-concentration doping layer may not substantially include Mg balls.

A thickness of the low-concentration doping layer may be greater than a total thickness of the electron blocking layer, the high-concentration doping layer, and the contact layer.

The low-concentration doping layer may have a doping profile that changes according to a thickness, and a lowest doping concentration may be less than $5E19/cm^3$.

The low-concentration doping layer may have an Al content of about 0.5 atomic % or less, or may not include Al. A region in which an Al composition decreases as a distance from the active region increases may be included in the electron blocking layer and the high-concentration doping layer.

A point having a peak Al content in the second conductivity type semiconductor region may be positioned in the electron blocking layer.

The Mg balls in the electron blocking layer may be spaced apart from the active region.

In an embodiment, the light emitting device may emit blue light or green light.

In an embodiment, the light emitting device may emit blue light and green light.

BRIEF DESCRIPTION OF THE DRA WINGS

FIGS. 11A and 11B are schematic band diagrams illustrating a light emitting device according to an embodiment of the present disclosure.

FIG. 12 is a schematic cross-sectional view illustrating a second conductivity type semiconductor region according to an embodiment of the present disclosure.

Figure 27A:
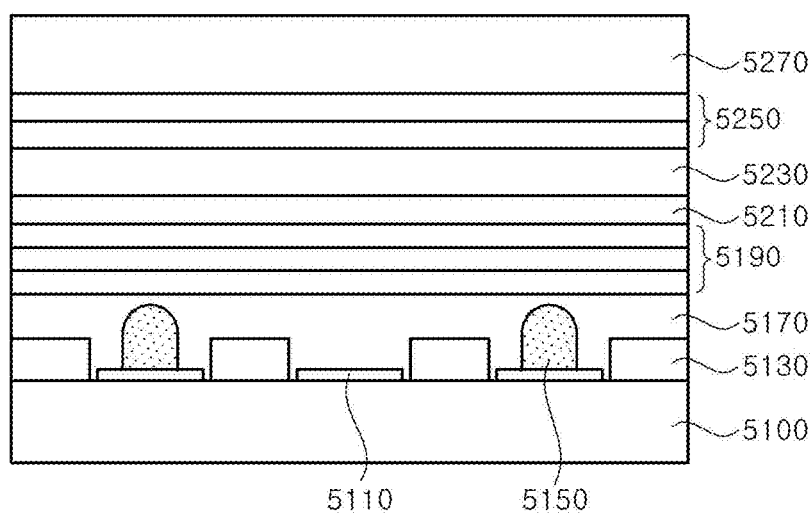
Figure 27B:
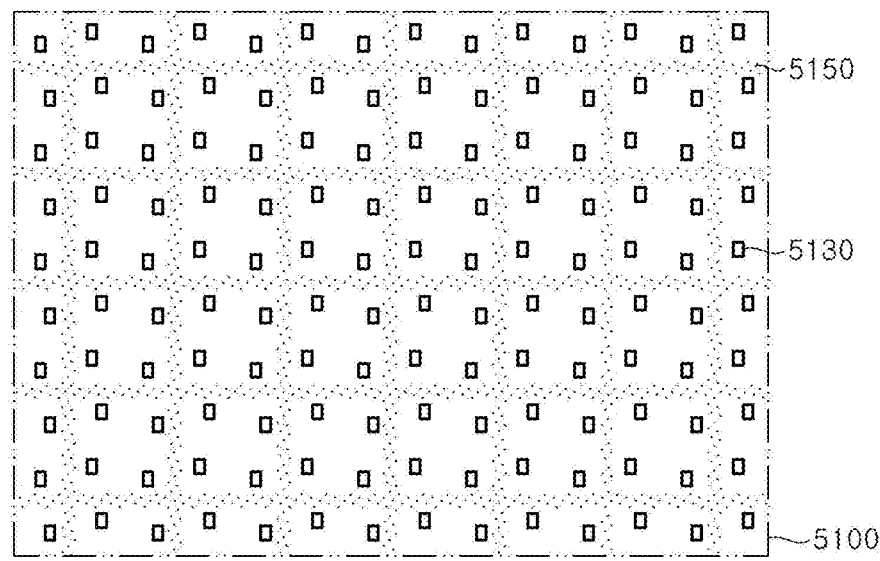
Figure 27C:
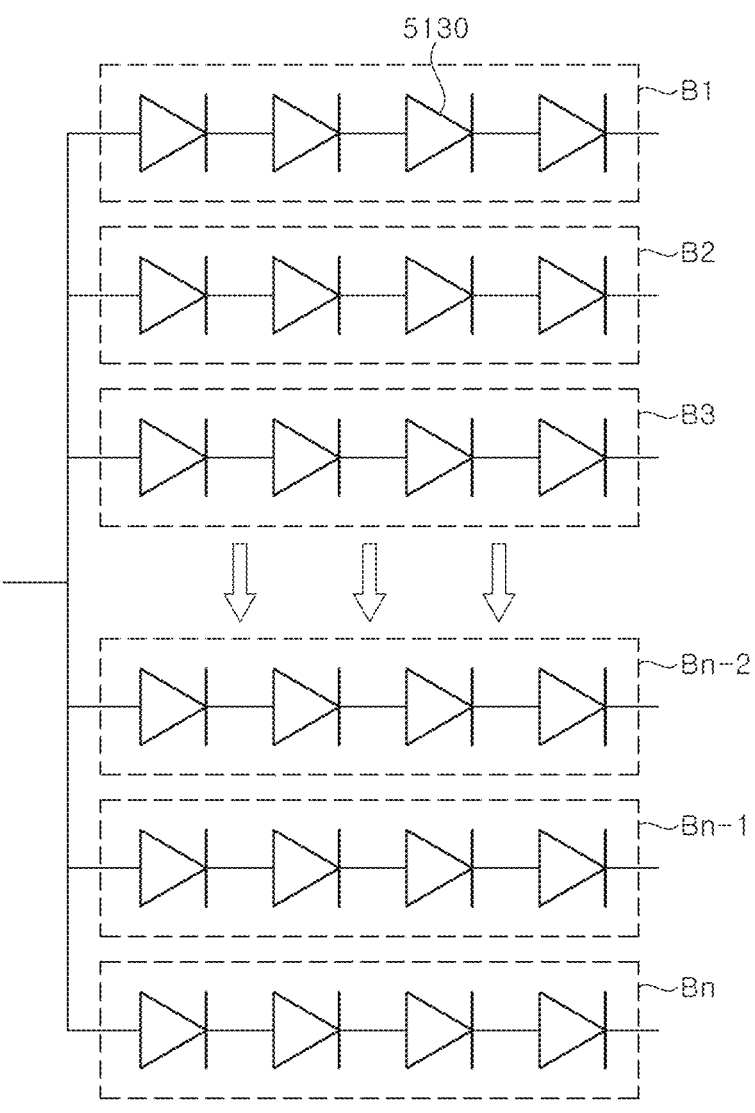

FIGS. 27A, 27B, and 27C are a schematic cross-sectional view, a plan view, and a circuit diagram illustrating a display apparatus to which a light emitting device according to another embodiment of the present disclosure is applied, respectively.

DETAILED DESCRIPTION OF EMBODIMENTS

Hereinafter, exemplary embodiments of the present disclosure will be described in detail with reference to the accompanying drawings. The following exemplary embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. In addition, when an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Figure 1:
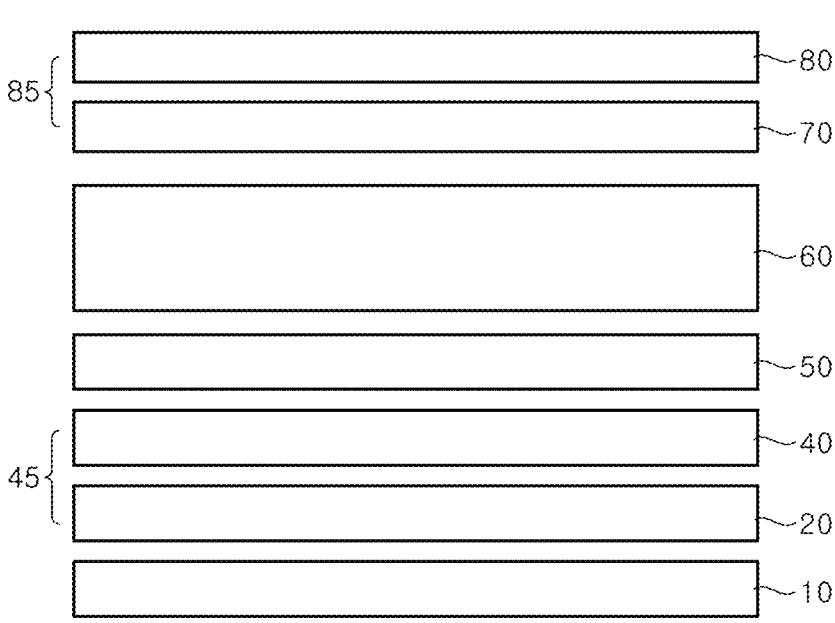
FIG. 1 is a schematic cross-sectional view illustrating a light emitting device according to an embodiment of the present disclosure.

FIG. 1 is a schematic cross-sectional view illustrating a light emitting device according to an embodiment of the present disclosure.

Referring to FIG. 1, the light emitting device according to this embodiment may include a base 10, a buffer layer 20, a first conductivity type semiconductor layer 40, a control portion 50, a light emitting region 60, a resistor 70, and a second conductivity type semiconductor layer 80.

The base 10 may be a printed circuit board, a sapphire substrate, a silicon substrate, a GaN substrate, polyimide, an epoxy molding compound (EMC), or the like. The base 10 may be disposed on a path through which light emitted from the light emitting region 60 passes or transmits. Light may pass through the base 10 and be emitted to the outside of the light emitting device.

The base 10 may have a concavo-convex shape on its surface, and light may be scattered using the concavo-convex shape. When the light emitting region 60 emits light having a plurality of peak wavelengths, light having different peak wavelengths may be mixed in the base 10. That is, the base 10 may serve as a mixing zone of light.

The buffer layer 20 is a low-temperature buffer layer for growing a gallium nitride-based semiconductor layer on a heterogeneous substrate, for example, a nucleation layer, and may be formed of, for example, an undoped AlGaN layer. A high-temperature buffer layer, for example, an undoped GaN layer, may be further formed on the buffer layer 20.

The first conductivity type semiconductor layer 40 may serve as a contact layer for supplying electricity to the light emitting device. The first conductivity type semiconductor layer 40 may include a III-V material such as AlxIn(y)Ga(1-x-y)N (x, y>=0), GaAs, or GaInP, and may be doped with a dopant such as Si. The buffer layer 20 and the first conductivity type semiconductor layer 40 may constitute a first conductivity type semiconductor region 45.

The light emitting region 60 may be formed on the first conductivity type semiconductor layer 40. The light emitting region 60 may include a III-V material such as AlxIn(y)Ga (1-x-y)N (x, y>=0), GaAs, or GaInP. The light emitting region 60 may include light emitting portions emitting blue light or green light, or may have a structure in which a plurality of light emitting portions emitting light of different colors is vertically stacked with one another. The plurality of light emitting portions may include a first light emitting portion and a second light emitting portion. Each of the light emitting portions may have different types of color materials that determine a peak wavelength, CIE, or CRI of emitted light, or may have different amounts of color materials. For example, the first light emitting portion and the second light emitting portion may have different peak wavelengths, and the color material of the first light emitting portion may emit light of a shorter wavelength than the color material of the second light emitting portion. For example, the first light emitting portion may emit blue light, and the second light emitting portion may emit green or yellow light.

In an embodiment, the first light emitting portion emitting light of a relatively shorter peak wavelength may be disposed closer to the first conductivity type semiconductor layer 40 than the second light emitting portion, and the second light emitting portion emitting light having a relatively longer peak wavelength may be disposed closer to the second conductivity type semiconductor layer 80 than the first light emitting portion. However, the inventive concepts are not limited thereto, and positions of the first light emitting portion and the second light emitting portion may be changed according to a device structure.

The electron blocking layer 70 may be formed on the light emitting region 60. The electron blocking layer 70 serves as a resistor in a flow of current, and may function as a barrier to prevent electrons injected from the first conductivity type semiconductor layer 40 from flowing into the second conductivity type semiconductor layer 80. The electron blocking layer 70 may include a III-V material such as AlxIn(y)Ga(1-x-y)N (x>=0), GaAs, or GaInP, and may have an energy band gap wider than those of the first and second conductivity type semiconductor layers 40 and 80. For example, an energy band gap of at least one layer of the electron blocking layer 70 may be wider than an energy band gap of at least one layer of the first and second conductivity type semiconductor layers 40 and 80 by 0.9 eV or more. The electron blocking layer 70 may be formed of a single layer or a plurality of layers. When formed of the plurality of layers, the electron blocking layer 70 may include a plurality of layers having different Al contents or band gap energies, and in this case, a layer having a relatively high Al content or a layer having a relatively wide band gap energy may be disposed closer to the light emitting region 60. A difference in Al contents between the layer with a relatively high Al content and a layer with a relatively low Al content may be within 10%, or a difference in band gap energies may be within 0.6 eV. In another embodiment, a profile of the Al content of the electron blocking layer 70 may be substantially similar to a profile of an In content of the electron blocking layer 70. That is, the In content may be relatively high where the Al content is relatively high, and the In content may be relatively low where the Al content is relatively low. However, the inventive concepts are not necessarily limited thereto, and the profile of the Al content and the profile of the In content may be different.

Figure 2:
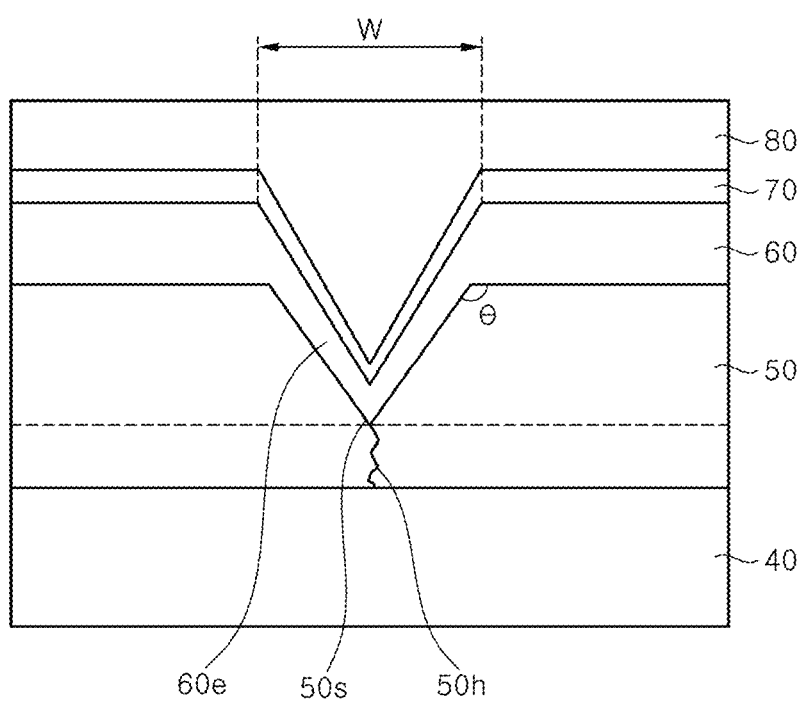
FIG. 2 is an enlarged cross-sectional view of a portion of FIG. 1.

The control portion 50 may be formed between the first conductivity type semiconductor layer 40 and the light emitting region 60. As shown in FIG. 2, the control portion 50 may include a holder 50h generating a spot 50s. The control portion 50 may include a material such as InGaN, GaN, InGaAs, GaAs, or the like, and a portion of the light emitting region 60 may extend toward the spot 50s by the spot 50s formed on the holder 50h to form an extension 60e. The holder 50h may be formed by forming a holding layer using a TMGa material. The holder 50h may have a height of about 1000 Å to about 2500 Å. A plurality of holders 50h may be formed in the control portion 50, and the plurality of holders 50h may be laterally spaced apart.

The control portion 50 may include an expansion portion at a boundary portion with the light emitting region 60. The expansion portion assists to form a larger extension 60e of the light emitting region 60 extending in a direction of the spot 50s of the holder 50h. The extension 60e may be formed in a V shape, and may include a color portion. The expansion portion may be formed of a single layer or a plurality of layers, and may include, for example, a superlattice structure. A material for the expansion portion may include a III-V material such as AlxIn(1-x)GaN (x, y>=0), GaAs, or GaInP, and may include a dopant such as Si. In a case of including the dopant, a doping concentration may be in a concentration range of 1E17 to 5E18/cm$^3$. The expansion portion may be formed within a thickness range of 1000 Å to 2500 Å. The expansion portion may have a band gap corresponding to an energy of light having a wavelength of 405 nm or less. The superlattice structure for the expansion portion may have, for example, a structure in which InGaN/GaN are repeatedly stacked. However, the inventive concepts are not limited thereto, and may include at least two or more layers having different doping concentrations from each other, or at least two or more layers having different band gap energies from each other.

The control portion 50 may further include an intermediate layer between the holder 50h and the expansion portion. The intermediate layer may be formed of a plurality of layers, may include a III-V material such as AlxIn(y)Ga(1-x-y)N (x, y>=0), GaAs, or GaInP, and each of the plurality of layers may have a thickness of about 10 Å to 150 Å.

The second conductivity type semiconductor layer 80 may be formed on the electron blocking layer 70. The second conductivity type semiconductor layer 80 may have a polarity opposite to that of the first conductivity type semiconductor layer 40, and may include, for example, a material such as Mg, B, or the like. The electron blocking layer 70 and the second conductivity type semiconductor layer 80 may constitute a first conductivity type semiconductor region 85. The material such as Mg, B, or the like of the second conductivity type semiconductor layer 80 may have an inclined profile, and may have a left-right asymmetrical profile with respect to a peak point having a highest content of the material. Preferably, a slope of a profile in a direction closer to the light emitting region 60 with respect to the peak point may be relatively gentler than a slope of a profile disposed opposite to the peak point.

Although not shown in the drawing, a bridge region having a same polarity as that of the first conductivity type semiconductor layer 40 may be further formed on the second conductivity type semiconductor layer 80. A light emitting region emitting light of a different color may be further formed on the light emitting device of the embodiment via the bridge region.

Figure 3:
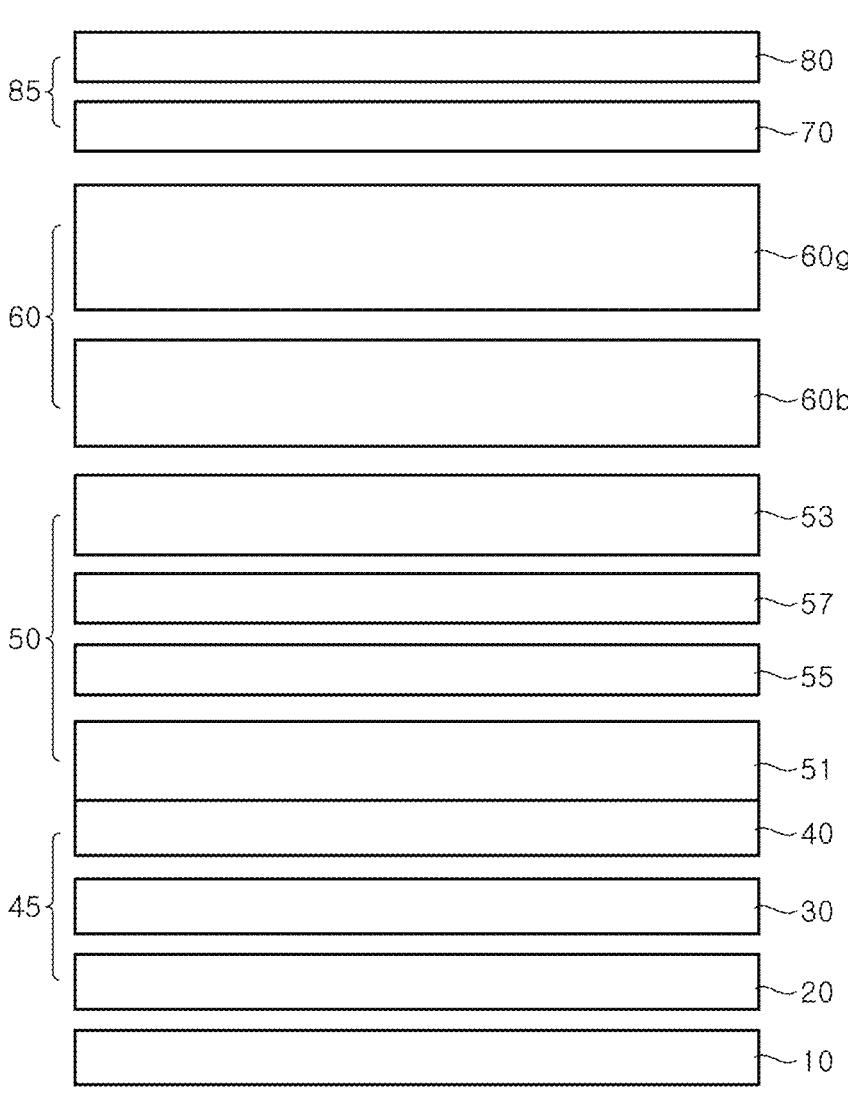
FIG. 3 is a schematic cross-sectional view illustrating a light emitting device according to an embodiment of the present disclosure.

Hereinafter, a specific example of the light emitting device will be described in more detail with reference to FIG. 3. FIG. 3 is a schematic cross-sectional view illustrating a light emitting device according to an embodiment of the present disclosure.

Referring to FIG. 3, the light emitting device according to this embodiment, as described with reference to FIG. 1, may include a base 10, a first conductivity type semiconductor region 45, a control portion 50, a light emitting region 60, and a second conductivity type semiconductor region 85.

Since the base 10 is same as that described with reference to FIG. 1, a detailed description thereof will be omitted to avoid redundancy. The first conductivity type semiconductor region 45 may include a buffer layer 20, an undoped GaN layer 30, and a first conductivity type semiconductor layer 40. The first conductivity type semiconductor region 45 of this embodiment is same as the first conductivity type semiconductor region 45 described with reference to FIG. 1, except that the undoped GaN layer 30 is clearly shown in the drawing, and a detailed description thereof is omitted.

The control portion 50 may be formed of a plurality of layers. As shown in FIG. 3, the control portion 50 may include a first V-pit generation layer (VGL, 51), a first intermediate layer 55, a second intermediate layer 57, and a second VGL 53. Each of the layers of the control portion 50 may be formed of AlxInyGa(1-x-y)N (x, y>=0), GaAs, or GaInP, and each of the first and second intermediate layers may include layers having different band gap energies from each other, respectively.

As shown in FIG. 3, among the layers of the control portion 50, the first VGL 51 may be disposed closest to the first conductivity type semiconductor layer 40, and the second VGL 53 may be closest to a second conductivity type semiconductor layer 80. The first intermediate layer 55 and the second intermediate layer 57 may be disposed between the first VGL 51 and the second VGL 53. An additional layer may be further included between these layers, but the inventive concepts are not necessarily limited thereto.

The first VGL 51 may be grown at a temperature lower than a growth temperature of the first conductivity type semiconductor layer 40, for example, 900° C. or less, and may include a GaN layer. The first VGL 51 may be formed using a TMGa source to increase a growth rate, which may adjust a size and a density of a holder, for example, a V-pit. The first VGL 51 may be formed to have a thickness within a range of about 1000 Å to about 2500 Å. The first VGL 51 may have a larger thickness than that of the second VGL 53, and a thickness difference may be preferable within 30%. A sum of the thicknesses of the first VGL 51 and the second VGL 53 may be greater than a sum of the thicknesses of the light emitting region 60. Alternatively, the sum of the thicknesses of the first VGL 51 and the second VGL 53 may be greater than a sum of thicknesses of the electron blocking layer 70 and the second conductivity type semiconductor layer 80. Alternatively, the sum of the thicknesses of the first VGL 51 and the second VGL 53 may be greater than a thickness from an interface between the second VGL 51 and an adjacent layer in a direction of the light emitting region 60 to an interface where the second conductivity type semiconductor layer 80 is electrically connected to a conductive electrode. In this case, the difference in thicknesses may be 1.5 times or more. A doping concentration of the first conductivity type semiconductor layer 40 may be 7 times greater than that of at least one of the first VGL 51 and the second VGL 53.

The first intermediate layer 55 or the second intermediate layer 57 is a layer added to substantially control strain, and may be formed of AlN, AlxGa(1-x)N, or GaN. Each of the first and second intermediate layers 55 and 57 may have a thickness of about 10 Å to about 150 Å. The first intermediate layer 55 or the second intermediate layer 57 may include an n-type dopant. A doping concentration of the first intermediate layer 55 or the second intermediate layer 57 may be lower than that of the first conductivity type semiconductor layer 40, and higher than that of the second VGL 53.

The second VGL 53 may be a single layer or a plurality of layers, and may have a superlattice structure, but the inventive concepts are not necessarily limited thereto. The second VGL 53 may be formed of InGaN/GaN, GaN, or InGaN, and for example, it may be InGaN/GaN containing In to have an energy band gap corresponding to an energy of a wavelength of 405 nm or less. In this case, the second VGL 53 may grow relatively slowly along a V-pit structure formed in the first VGL 51 by using a TEGa source as a Ga source. The second VGL 53 may be grown at a temperature lower than the growth temperature of the first conductivity type semiconductor layer 40, for example, 900° C. or lower. The second VGL 53 may be formed to have a thickness of about 1000 Å to about 2500 Å, and may be doped with impurities. For example, a doping concentration of silicon doped into the second VGL 53 may be 1E17 to 5E18/cm³.

When analyzed with SIMS (secondary ion mass spectrometry), a material having a largest standard atomic weight (relative atomic mass or standard atomic weight) or a material having a largest atomic number among group 3 elements included in the light emitting device may be detected in the second VGL 53. A detection amount of the material having the largest standard atomic weight or atomic number may gradually decrease toward a direction of the first conductivity type semiconductor layer 40. When analyzed with SIMS, a thickness of a gradually decreasing region of the material having the largest standard atomic weight or atomic number may be detected as a larger thickness than a thickness of the light emitting region 60. Accordingly, since the region in which the material having the largest standard atomic weight or atomic number is detected is formed wide in a region between the first conductivity type semiconductor layer 40 and the second conductivity type semiconductor layer 80, it makes it possible to effectively generate white light in the light emitting region 60.

The light emitting region 60 may include a plurality of light emitting portions 60b and 60g. For example, a first light emitting portion 60b may emit blue light, and a second light emitting portion 60g may emit green or yellow light. The first and second light emitting portions 60b and 60g may have a single or multiple quantum well structure, and may include an InGaN, InAlGaN, GaInP, or GaInAlP well layer.

A V-shaped extension (60e in FIG. 3) is formed by the control portion 50, and thus, strain relief of the light emitting region 60 occurs. Accordingly, a greater amount of In may flow into the light emitting region 60, and thus, a radiation efficiency of the plurality of light emitting portions may be improved in a single LED structure, and white light may be implemented without a phosphor.

Figure 4:
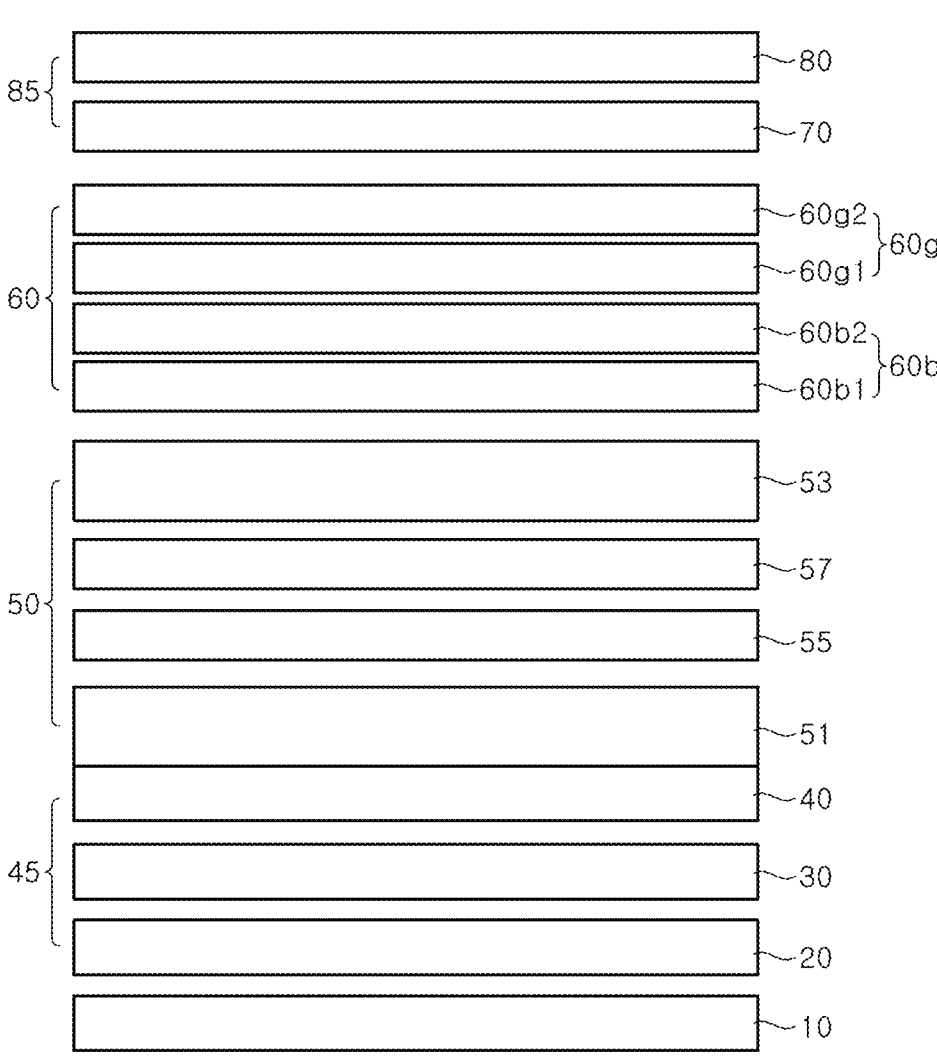
FIG. 4 is a schematic cross-sectional view illustrating a light emitting device according to an embodiment of the present disclosure.

FIG. 4 is a schematic cross-sectional view illustrating a light emitting device according to another embodiment of the present disclosure.

Referring to FIG. 4, the light emitting device according to this embodiment is generally similar to the light emitting device described with reference to FIG. 3, except that the light emitting portions in the light emitting region 60 include sub-light emitting portions. That is, the first light emitting portion 60b may include first and second sub-light emitting portions 60b1 and 60b2, and the second light emitting portion 60g may include first and second sub-light emitting portions 60g1 and 60g2. Each of the first and second sub-light emitting portions 60b1 and 60b2 may have a single quantum well structure emitting light in a blue region, and each of the first and second sub-light emitting portions 60g1 and 60g2 may have a single quantum well structure emitting light in a green or yellow region.

The second sub-light emitting portion 60b2 may emit light having a longer wavelength than that of the first sub-light emitting portion 60b1. Specifically, the first sub-light emitting portion 60b1 may emit light having a peak wavelength within a range of 410 nm to 455 nm, and the second sub-light emitting portion 60b2 may emit light having a peak wavelength within a range of 455 nm to 495 nm. The second sub-light emitting portion 60g2 may emit light having a longer wavelength than that of the first sub-light emitting portion 60g1. For example, the first sub-light emitting portion 60g1 may emit light having a peak wavelength within a range of 505 nm to 550 nm, and the second sub-light emitting portion 60g2 may emit light having a peak wavelength within a range of 550 nm to 605 nm. In an embodiment, a gap between a peak wavelength of light emitted from the first sub-light emitting portion 60b1 and a peak wavelength of light emitted from the second sub-light emitting portion 60b2 may be 100 nm or less, and a gap between the peak wavelength of light emitted from the first sub-colored portion 60g1 and the peak wavelength of light emitted from the second sub-colored portion 60g2 may be 100 nm or less. A minimum gap between the peak wavelength of light emitted from the first light emitting portion 60b and the peak wavelength of light emitted from the second light emitting portion 60g may be 200 nm or less. For example, the gap between the peak wavelength of light emitted from the second sub-light emitting portion 60b2 and the peak wavelength of light emitted from the first sub-light emitting portion 60g1 may be 200 nm or less.

Visibility of light emitted from the light emitting device may be improved by controlling the peak wavelengths of light emitted from the first and second sub-light emitting portions 60b1 and 60b2 and the first and second sub-light emitting portions 60g1 and 60g2.

Figure 5:
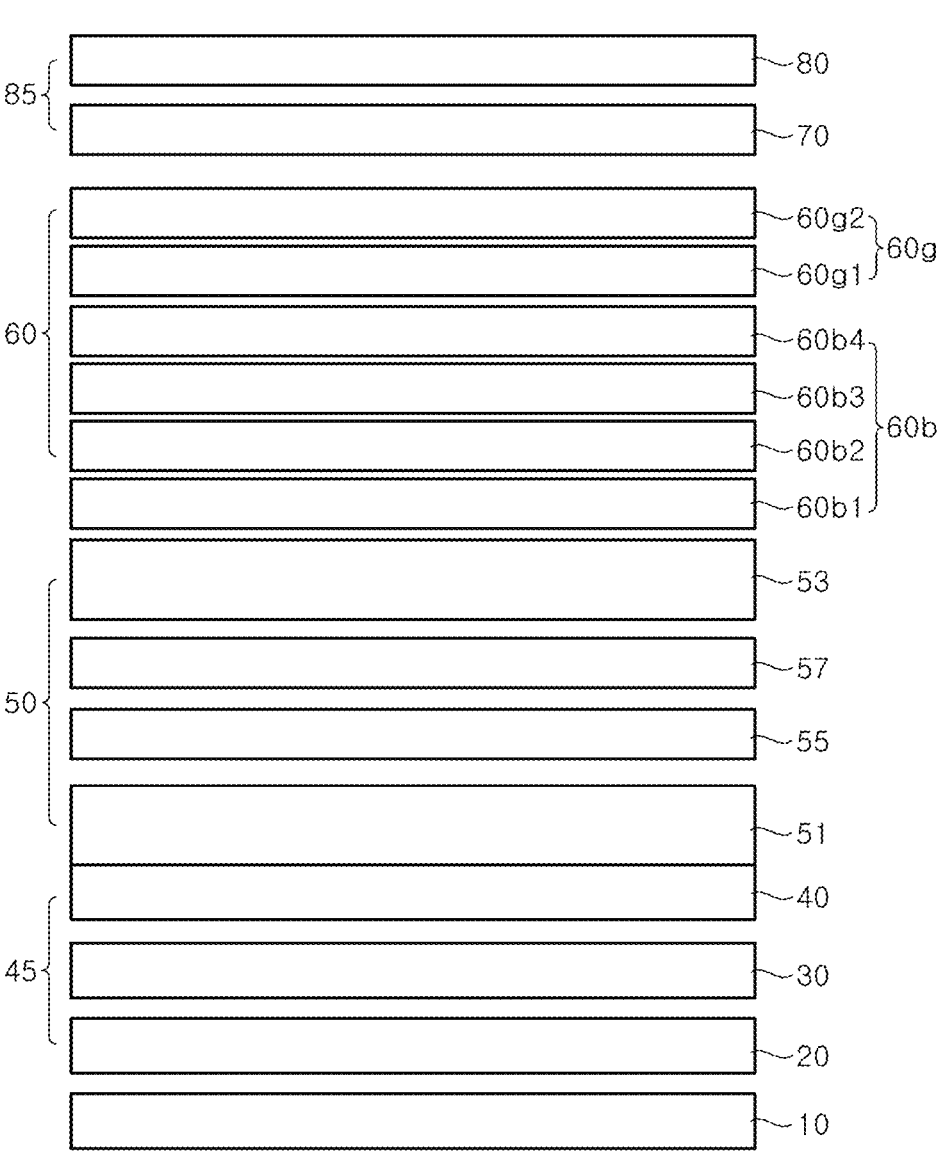
FIG. 5 is a schematic cross-sectional view illustrating a light emitting device according to an embodiment of the present disclosure.

FIG. 5 is a schematic cross-sectional view illustrating a light emitting device according to another embodiment of the present disclosure.

Referring to FIG. 5, the light emitting device according to this embodiment is substantially similar to the light emitting device described with reference to FIG. 4, except that the number of sub-light emitting portions 60b1 through 60b4 emitting blue light is more than the number of sub-light emitting portions 60g1 and 60g emitting green light or yellow light. The sub-light emitting portions 60b1 through 60b4 may emit light having substantially similar peak wavelengths, but may emit light having different peak wavelengths within a blue region. The sub-light emitting portions 60g1 and 60g2 may also emit light having substantially similar peak wavelengths, but may also emit light having different peak wavelengths within a green to yellow region.

There is a difference in luminous efficiency between the light emitting portion 60b and the light emitting portion 60g depending on a current density J applied to the light emitting device. By disposing more sub-light emitting portions 60b1 through 60b4 than the number of sub-light emitting portions 60g1 and 60g2, white light with a maximum efficiency may be implemented at a low current density within a range of 1.75 A/cm² to 35 A/cm².

Specifically, there may be two blue sub-light emitting portions per one green or yellow sub-light emitting portion (B/G ratio: 2/1), three blue sub-light emitting portions per one green or yellow sub-light emitting portion (B/G ratio: 3/1), four blue sub-light emitting portions per one green or yellow sub-light emitting portion (B/G ratio: 4/1), five blue sub-light emitting portions per one green or yellow sub-light emitting portion (B/G ratio: 5/1), six blue sub-light emitting portions per one green or yellow sub-light emitting portion (B/G ratio: 6/1), or seven blue sub-light emitting portions per one green or yellow sub-light emitting portion (B/G ratio) ratio: 7/1). In particular, the number of blue sub-light emitting portions per one green or yellow sub-light emitting portion may be 4 to 7, and within this range, white light having a favorable radiation efficiency may be implemented. A total number of blue sub-light emitting portions and green or yellow sub-light emitting portions may be 3 or more and 16 or less.

For this configuration, the first light emitting portion 60b emitting blue light is disposed close to the first conductivity type semiconductor layer 40, and the second light emitting portion 60g emitting green or yellow light is disposed close to the second conductivity type semiconductor layer 80.

Figure 6:
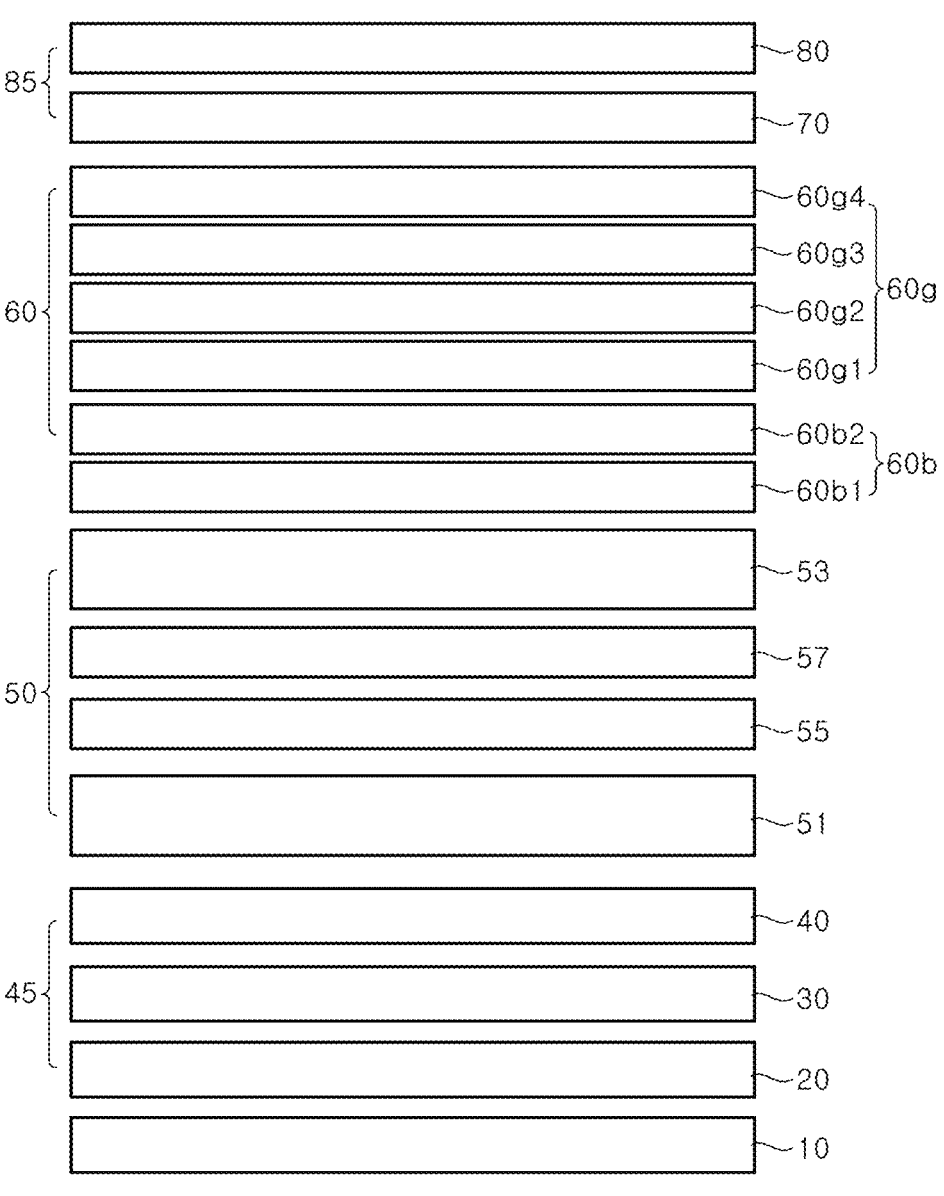
FIG. 6 is a schematic cross-sectional view illustrating a light emitting device according to an embodiment of the present disclosure.

FIG. 6 is a schematic cross-sectional view illustrating a light emitting device according to another embodiment of the present disclosure.

Referring to FIG. 6, the light emitting device according to this embodiment is substantially similar to the light emitting device described with reference to FIG. 4, except that the number of sub-light emitting portions 60b1 and 60b2 emitting blue light is less than the number of sub-light emitting portions 60g1 through 60g4 emitting green light or yellow light. That is, the number of sub-light emitting portions 60g1 through 60g4 is greater than the number of sub-light emitting portions 60b1 and 60b2.

There is a difference in luminous efficiency between the light emitting portion 60b and the light emitting portion 60g depending on a current density J applied to the light emitting device. By disposing the number of sub-light emitting portions 60g1 through 60g4 greater than or equal to the number of sub-light emitting portions 60b1 and 60b2, white light with a maximum efficiency may be implemented at a high current density within a range of 35 A/cm² to 140 A/cm².

Specifically, there may be one green or yellow sub-light emitting portion per one blue sub-light emitting portion (B/G ratio: 1/1), two green or yellow sub-light emitting portions per one blue sub-light emitting portion (B/G ratio: 1/2), three green or yellow sub-light emitting portions per one blue sub-light emitting portion (B/G ratio: 1/3), four green or yellow sub-light emitting portions for one blue sub-light emitting portion (B/G ratio: 1/4), five green or yellow sub-light emitting portions per one blue sub-light emitting portion (B/G ratio: 1/5), six green or yellow sub-light emitting portions for one blue sub-light emitting portion (B/G ratio: 1/6), or seven green or yellow sub-light emitting portions per one blue sub-light emitting portion (B/G ratio: 1/7). In particular, the number of green or yellow sub-light emitting portions per one blue sub-light emitting portion may be 1 to 4, and within this range, white light having a favorable radiation efficiency may be implemented. A total number of blue sub-light emitting portions and green or yellow sub-light emitting portions may be 2 or more and 15 or less.

For this configuration, the first light emitting portion 60b emitting blue light is disposed close to the first conductivity type semiconductor layer 40, and the second light emitting portion 60g emitting green or yellow light is disposed close to the second conductivity type semiconductor layer 80.

Figure 7:
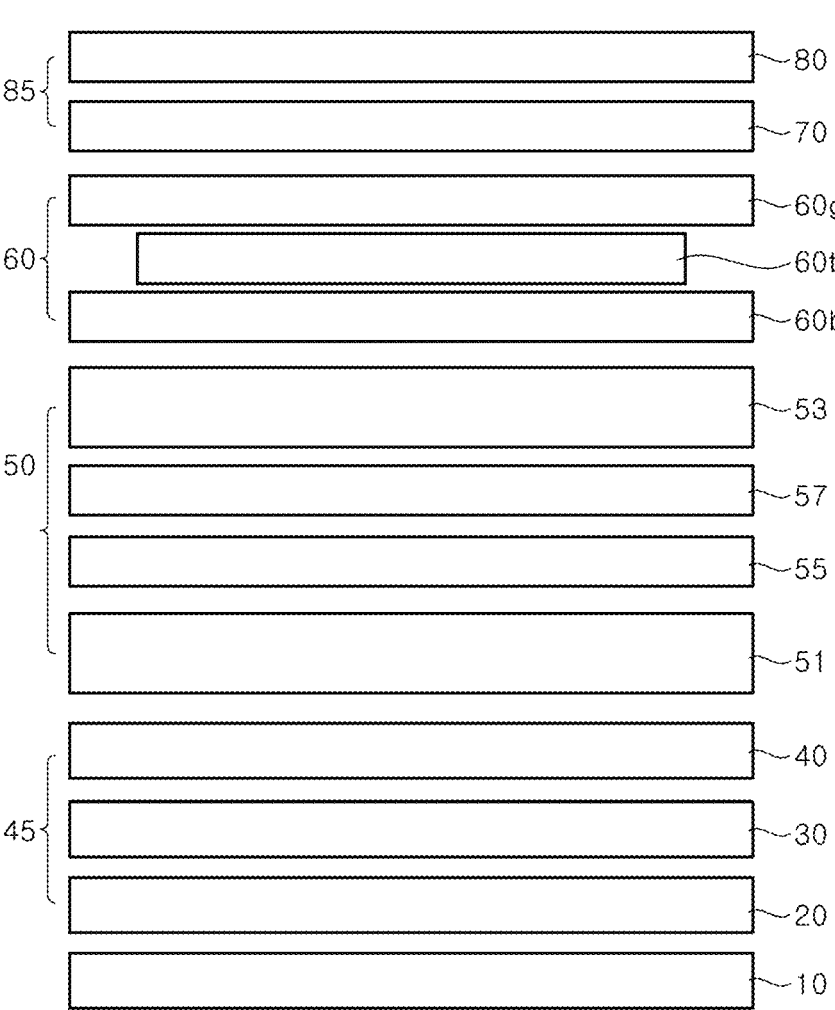
FIG. 7 is a schematic cross-sectional view illustrating a light emitting device according to an embodiment of the present disclosure.

FIG. 7 is a schematic cross-sectional view illustrating a light emitting device according to another embodiment of the present disclosure.

Referring to FIG. 7, the light emitting device according to this embodiment is substantially similar to the light emitting device described with reference to FIG. 3, except that a tunnel barrier layer 60t is disposed between the first light emitting portion 60b and the second light emitting portion 60g.

The tunnel barrier layer 60t is disposed between the light emitting portions 60b and 60g having different band gaps and emitting light of different peak wavelengths to relieve light interference between the light emitting portions. The tunnel barrier layer 60t may be applied to both the light emitting device suitable for the low current density described with reference to FIG. 5 and the light emitting device suitable for the high current density described with reference to FIG. 6. By disposing the tunnel barrier layer 60t, white light with high efficiency may be implemented by combining a luminous intensity of blue light and a luminous intensity of green light or yellow light optimized at the low current density of less than 35 A/cm$^2$ and the high current density of 35 A/cm$^2$ or more, electroluminescence intensities of the light emitting portions 60b and 60g may be adjusted, respectively, and accordingly, a visibility of the light emitting devices may be improved.

Specifically, the tunnel barrier layer 60t may be disposed between the first light emitting portion 60b and the second light emitting portion 60g. The first light emitting portion 60b is disposed close to the first conductivity type semiconductor layer 40, and the second light emitting portion 60g is disposed close to the second conductivity type semiconductor layer 80. The tunnel barrier layer 60t may include an AlGaN layer or a material layer capable of serving as a color filter, such as DBR. For example, a radiation efficiency of the light emitting device may be increased by preventing shorter wavelength light emitted from the first light emitting portion 60b from affecting the second light emitting portion 60g.

Figure 8A:
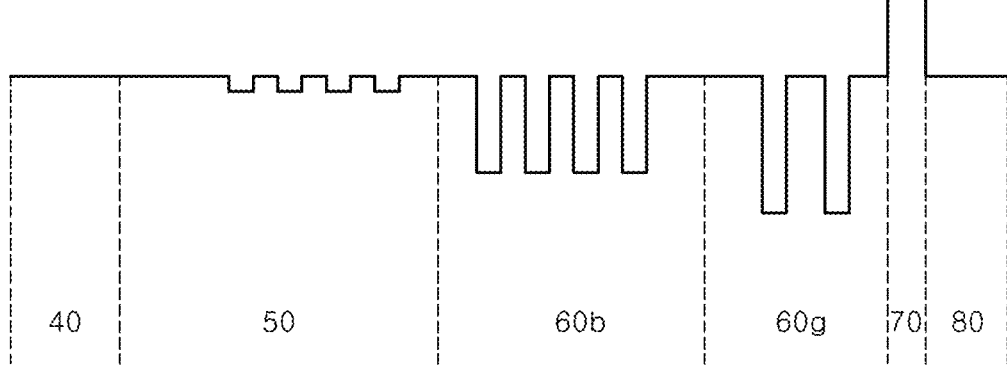
FIG. 8A is a schematic band diagram illustrating a light emitting device according to an embodiment of the present disclosure.
Figure 8B:
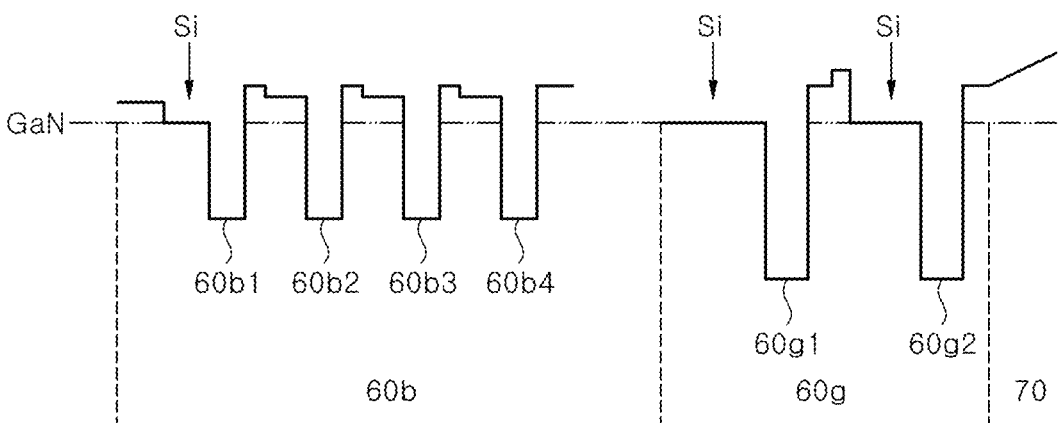
FIG. 8B is a band diagram showing an enlarged light emitting region of FIG. 8A.

FIG. 8A is a schematic band diagram illustrating a light emitting device according to an embodiment of the present disclosure, and FIG. 8B is a band diagram showing enlarged portions of a first light emitting portion 60b and a second light emitting portion 60g. In FIGS. 8A and 8B, only conduction bands are shown, and in FIG. 8B, a position of the conduction band of each layer is shown with respect to a conduction band of GaN.

Referring to FIGS. 8A and 8B, the light emitting device according to this embodiment implements white light with high efficiency through a combination of blue luminous intensity and green luminous intensity optimized under a low current density, for example, a current density in a range of 1.75 A/cm$^2$ to 35 A/cm$^2$. Each of a well layer and a barrier layer of a light emitting region including the first light emitting portion 60b and a second light emitting portion 60g is configured such that light emitted from the first light emitting portion 60b and the second light emitting portion 60g can be combined with high efficiency. Specifically, the first light emitting portion 60b emitting blue light includes a plurality of sub-light emitting portions 60b1, 60b2, 60b3, and 60b4, and the second light emitting portion 60g emitting green or yellow light includes a plurality of sub-light emitting portions 60g1 and 60g2.

In the first light emitting portion 60b, the well layers are disposed between the barrier layers, and the well layers correspond to the sub-light emitting portions 60b1, 60b2, 60b3, and 60b4, respectively. Specifically, as shown in FIG. 8B, in the first light emitting portion 60b, four well layers may be disposed between a first barrier layer and a last barrier layer, and intermediate barrier layers may be disposed between the well layers. Herein, although the number of well layers of the first light emitting portion is illustrated as four, the inventive concepts are not limited thereto. However, the well layers of the first light emitting portion 60b are disposed in a larger number than that of the well layers of the second light emitting portion 60g. Holes move from a second conductivity type semiconductor layer 80 to the second light emitting portion 60g and the first light emitting portion 60b. However, since holes have low mobility, they are difficult to move from a second conductivity type semiconductor layer 80 to the first light emitting portion 60b under a low current density. Therefore, when the number of well layers of the first light emitting portion 60b is same as the number of well layers of the second light emitting portion 60g, a luminous intensity of blue light becomes lower than a luminous intensity of green light, and thus, it is difficult to implement white light. On the contrary, by increasing the number of well layers of the first light emitting portion 60b, the luminous intensity of blue light may be increased, and white light may be implemented. Furthermore, by adjusting a ratio between the number of well layers of the first light emitting portion 60b and the number of well layers of the second light emitting portion 60g, various white light from warm white to cool white may be implemented.

Meanwhile, the first barrier layer of the first light emitting portion 60b may include a GaN layer, and other barrier layers may include an AlGaN layer. The GaN layer of the first barrier layer of the first light emitting portion 60b may be doped with an n-type impurity, for example, Si, and a doping concentration may be within a range of, for example, 5E18/cm$^3$ to 8E18/cm$^3$. No intentional doping is performed on the other barrier layers. The first barrier layer may also include a hole blocking layer, which may be formed of the AlGaN layer. The hole blocking layer may be disposed at a boundary between a control portion 50 and the first light emitting portion 60b. Meanwhile, the barrier layers disposed between the well layers of the first light emitting portion 60b may be formed of the AlGaN layer. Specifically, each of the barrier layers may include an AlGaN capping layer and a high-temperature AlGaN barrier layer, and the AlGaN capping layer may have a band gap wider than the high-temperature AlGaN barrier layer. The AlGaN capping layer may be made thinner than the high-temperature AlGaN barrier layer. For example, the AlGaN capping layer may be formed to have a thickness of about 1 nm and the high-temperature AlGaN barrier layer to have a thickness of about 35 Å. The AlGaN capping layer is grown at a temperature lower than that for growing the high-temperature AlGaN barrier layer, and for example, it may be grown at a same temperature as a growth temperature of the well layer.

Meanwhile, the well layers 60b1, 60b2, 60b3, and 60b4 may be formed of InGaN or InAlGaN, and may have a composition that emits light in a blue region. The well layers may have a same composition, but the inventive concepts are not limited thereto, and the well layers may have different band gaps from one another.

The second light emitting portion 60g is shown as having two sub-light emitting portions 60g1 and 60g2 disposed between the first and last barrier layers, but the number of the sub-light emitting portions 60g1 and 60g2 is not limited thereto.

A first barrier layer of the second light emitting portion 60g may be a GaN layer, and a last barrier layer may be an AlGaN layer. In addition, barrier layers disposed between the well layers may include an AlGaN capping layer, an Al(Ga)N layer, and a GaN layer. In the second light emitting portion 60g, GaN layers of remaining barrier layers except for the last barrier layer may be doped with an n-type impurity, for example, Si. A doping concentration of Si doped in each of the barrier layers of the second light emitting portion 60g may be lower than the doping concentration of Si doped in the first barrier layer of the first light emitting portion 60b, and for example, it may be within a range of 5E17/cm³ to 1E18/cm³.

Meanwhile, a thickness of each of the well layers of the second light emitting portion 60g may be substantially similar to a thickness of each of the well layers of the first light emitting portion 60b, but the thickness of each of the barrier layers of the second light emitting portion 60g may be greater than the thickness of each of the barrier layers of the first light emitting portion 60b.

An electron blocking layer 70 may be disposed to prevent electrons from flowing into the second conductivity type semiconductor layer 80 without recombination. The electron blocking layer 70 may be formed of an AlGaN layer, and as shown in FIG. 8B, it may be a grading layer in which a composition of Al gradually increases.

In this embodiment, the second light emitting portion 60g emitting green or yellow light is disposed adjacent to the second conductivity type semiconductor layer, and the first light emitting portion 60g emitting blue light is disposed adjacent to the first conductivity type semiconductor layer. Through this, it is possible to provide a light emitting device having improved visibility.

Figure 9A:
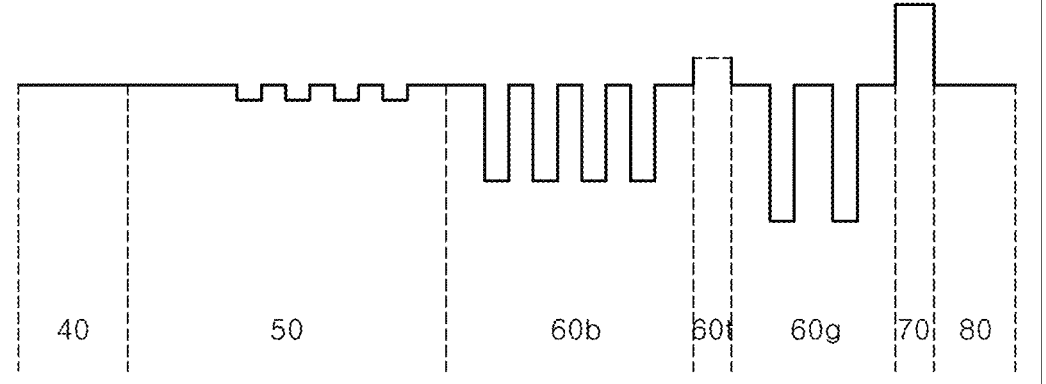
FIG. 9A is a schematic band diagram illustrating a light emitting device according to an embodiment of the present disclosure.
Figure 9B:
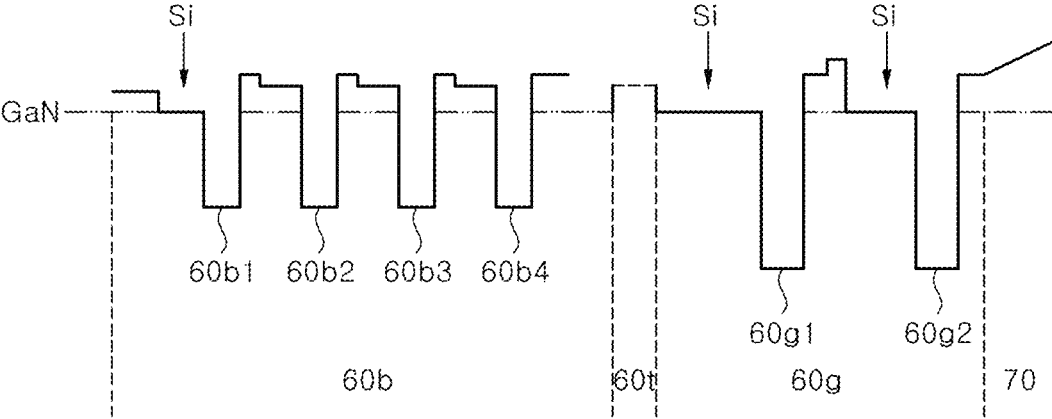
FIG. 9B is a band diagram showing an enlarged light emitting region of FIG. 9A.

FIG. 9A is a schematic band diagram illustrating a light emitting device according to another embodiment of the present disclosure, and FIG. 9B is a band diagram showing enlarged portions of a first light emitting portion 60b and a second light emitting portion 60g. In FIGS. 8A and 8B, only conduction bands are shown, and in FIG. 8B, a position of the conduction band of each layer is shown with respect to a conduction band of GaN.

Referring to FIGS. 9A and 9B, the light emitting device according to this embodiment is substantially similar to the light emitting device described with reference to FIGS. 8A and 8B, except that it includes an intermediate barrier layer 60t, that is, a tunnel barrier layer. The intermediate barrier layer 60t may be formed of an AlGaN layer, DBR, or the like. A band gap of the intermediate barrier layer 60t may be narrower than that of the barrier layers of the first and second light emitting portions 60b and 60g, without being limited thereto.

Figure 10A:
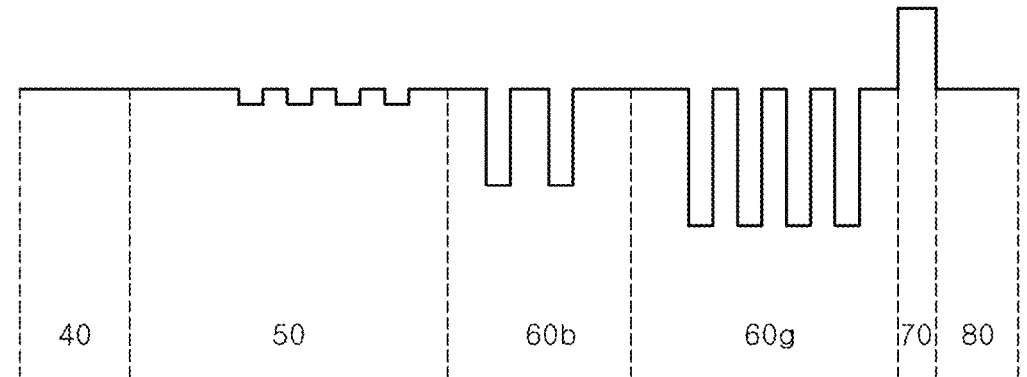
FIG. 10A is a schematic band diagram illustrating a light emitting device according to an embodiment of the present disclosure.
Figure 10B:
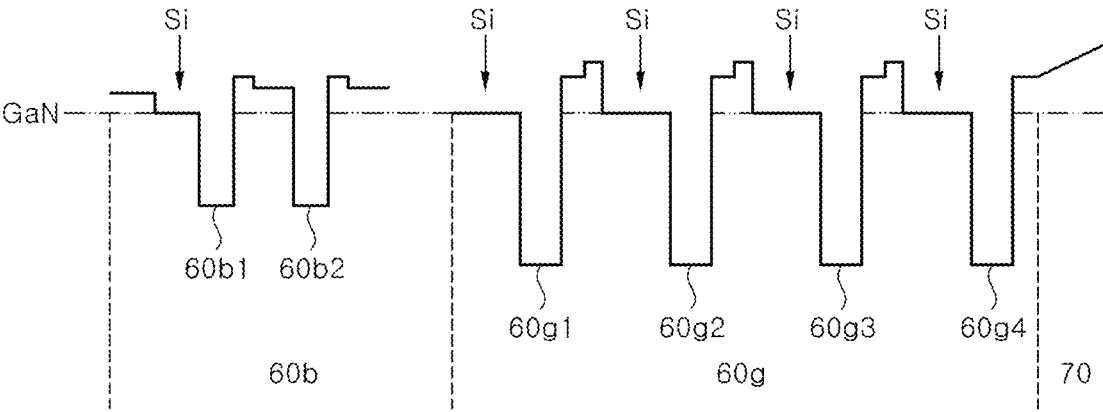
FIG. 10B is a band diagram showing an enlarged light emitting region of FIG. 10A.

FIG. 10A is a schematic band diagram illustrating a light emitting device according to another embodiment of the present disclosure, and FIG. 10B is a band diagram showing enlarged portions of a first light emitting portion 60b and a second light emitting portion 60g. In FIGS. 10A and 10B, only conduction bands are shown, and in FIG. 10B, a position of the conduction band of each layer is shown with respect to a conduction band of GaN.

Referring to FIGS. 10A and 10B, the light emitting device according to this embodiment implements white light with high efficiency through a combination of blue luminous intensity and green luminous intensity optimized under a high current density, for example, a current density in a range of 35 A/cm² to 140 A/cm². Each of a well layer and a barrier layer of a light emitting region including the first light emitting portion 60b and a second light emitting portion 60g is configured such that light emitted from the first light emitting portion 60b and the second light emitting portion 60g can be combined with high efficiency. Specifically, the first light emitting portion 60b emitting blue light includes a plurality of sub-light emitting portions 60b1 and 60b2, and the second light emitting portion 60g emitting green or yellow light includes a plurality of sub-light emitting portions 60g1. 60g2, 60g3, and 60g4.

In the first light emitting portion 60b, the well layers are disposed between the barrier layers, and the well layers correspond to the sub-light emitting portions 60b1 and 60b2, respectively. Specifically, as shown in FIG. 10B, in the first light emitting portion 60b, two well layers may be disposed between a first barrier layer and a last barrier layer, and intermediate barrier layers may be disposed between the well layers. Herein, although the number of well layers of the first light emitting portion is illustrated as two, the inventive concepts are not limited thereto. However, the well layers of the first light emitting portion 60b are disposed in a smaller number than that of the well layers of the second light emitting portion 60g. Holes move from a second conductivity type semiconductor layer 80 to the second light emitting portion 60g and the first light emitting portion 60b. However, since holes easily move from the second conductivity type semiconductor layer 80 to the first light emitting portion 60b under the high current density, a recombination rate of electrons and holes in the first light emitting portion 60b increases. Therefore, when the number of well layers of the first light emitting portion 60b is greater than the number of well layers of the second light emitting portion 60g, a luminous intensity of blue light is relatively higher than a luminous intensity of green light, and thus, it is difficult to implement white light. On the contrary, by making the number of well layers of the first light emitting portion 60b equal to or less than the number of well layers of the second light emitting portion 60g, the luminous intensity of blue light may be relatively reduced, and through this, desired white light may be implemented. Furthermore, by adjusting a ratio between the number of well layers of the first light emitting portion 60b and the number of well layers of the second light emitting portion 60g, various white light from warm white to cool white may be implemented.

Meanwhile, the first barrier layer of the first light emitting portion 60b may include a GaN layer, and other barrier layers may include an AlGaN layer. The GaN layer of the first barrier layer of the first light emitting portion 60b may be doped with an n-type impurity, for example, Si, and a doping concentration may be within a range of, for example, 5E18/cm³ to 8E18/cm³. No intentional doping is performed on the other barrier layers. The first barrier layer may also include a hole blocking layer, which may be formed of the AlGaN layer. The hole blocking layer may be disposed at a boundary between a control portion 50 and the first light emitting portion 60b. Meanwhile, the barrier layers disposed between the well layers of the first light emitting portion 60b may be formed of the AlGaN layer. Specifically, each of the barrier layers may include an AlGaN capping layer and a high-temperature AlGaN barrier layer, and the AlGaN capping layer may have a band gap wider than the high-temperature AlGaN barrier layer. The AlGaN capping layer may be made thinner than the high-temperature AlGaN barrier layer. For example, the AlGaN capping layer may be formed to have a thickness of about 1 nm and the high-temperature AlGaN barrier layer to have a thickness of about 35 Å. The AlGaN capping layer is grown at a temperature lower than that for growing the high-temperature AlGaN barrier layer, and for example, it may be grown at a same temperature as a growth temperature of the well layer.

Meanwhile, the well layers 60b1 and 60b2 may be formed of InGaN or InAlGaN, and may have a composition that emits light in a blue region. The well layers may have a same composition, but the inventive concepts are not limited thereto, and the well layers may have different band gaps from one another.

The second light emitting portion 60g is shown as having four sub-light emitting portions 60g1, 60g2, 60g3, and 60g disposed between the first and last barrier layers, but the number of the sub-light emitting portions 60g1, 60g2, and 60g3, and 60g4 is not limited thereto.

A first barrier layer of the second light emitting portion 60g may be a GaN layer, and a last barrier layer may be an AlGaN layer. In addition, barrier layers disposed between the well layers may include an AlGaN capping layer, an Al(Ga)N layer, and a GaN layer. In the second light emitting portion 60g, GaN layers of remaining barrier layers except for the last barrier layer may be doped with an n-type impurity, for example, Si. A doping concentration of Si doped in each of the barrier layers of the second light emitting portion 60g may be lower than the doping concentration of Si doped in the first barrier layer of the first light emitting portion 60b, and for example, it may be within a range of $5E17/cm^3$ to $1E18/cm^3$.

Meanwhile, a thickness of each of the well layers of the second light emitting portion 60g may be substantially similar to a thickness of each of the well layers of the first light emitting portion 60b, but the thickness of each of the barrier layers of the second light emitting portion 60g may be greater than the thickness of each of the barrier layers of the first light emitting portion 60b.

An electron blocking layer 70 may be disposed to prevent electrons from flowing into the second conductivity type semiconductor layer 80 without recombination. The electron blocking layer 70 may be formed of an AlGaN layer, and as shown in FIG. 8B, it may be a grading layer in which a composition of Al gradually increases.

In this embodiment, the second light emitting portion 60g emitting green or yellow light is disposed adjacent to the second conductivity type semiconductor layer, and the first light emitting portion 60g emitting blue light is disposed adjacent to the first conductivity type semiconductor layer. Through this, it is possible to provide a light emitting device having improved visibility.

FIG. 11A is a schematic band diagram illustrating a light emitting device according to another embodiment of the present disclosure, and FIG. 11B is a band diagram showing enlarged portions of a first light emitting portion 60b and a second light emitting portion 60g. In FIGS. 11A and 11B, only conduction bands are shown, and in FIG. 11B, a position of the conduction band of each layer is shown with respect to a conduction band of GaN.

Referring to FIGS. 11A and 11B, the light emitting device according to this embodiment is substantially similar to the light emitting device described with reference to FIGS. 10A and 10B, except that it includes an intermediate barrier layer 60t, that is, a tunnel barrier layer. The intermediate barrier layer 60t may be formed of an AlGaN layer, DBR, or the like. A band gap of the intermediate barrier layer 60t may be wider than that of the barrier layers of the first and second light emitting portions 60b and 60g, without being limited thereto.

FIG. 12 is a schematic cross-sectional view illustrating a second conductivity type semiconductor region according to an embodiment of the present disclosure.

Referring to FIG. 12, a second conductivity type semiconductor region 85a according to this embodiment may be used instead of the second conductivity type semiconductor region 85 of FIGS. 1 through 7. The second conductivity type semiconductor region 85a may include five layers 71, 73, 75, 81, and 83. A first layer 71 is a first layer of the second conductivity type semiconductor region 985a and is disposed on a last active layer (green active layer or blue active layer) to block electrons or serve as an electron blocking layer to reduce electron mobility. It may be an AlGaN layer or an AlN layer with a high Al composition ratio, a doping concentration of a p-type dopant may be $1E19/cm^3$ or less, and the p-type dopant may not be doped. A thickness of the first layer 71 may be greater than or equal to 10 Å and less than or equal to 50 Å.

A second layer 73 is a second layer disposed on the first layer 71 and serves to generate holes. A doping concentration of a p-type dopant, for example, Mg, doped into the second layer 73 may be in a range of $1E19$ to $5E20/cm^3$. The second layer 73 may be a four-component p-AlInGaN layer, and a growth temperature of the second layer 73 may be formed at a relatively low temperature of 800° C. or less. More specifically, the growth temperature of the second layer 73 is lower than growth temperatures of the first layer 71 and a third layer 75. A thickness of the second layer 73 may have a value within a range of 50 Å to 500 Å, and further within a range of 100 Å to 250 Å. The second layer 73 may be grown at a growth rate of 2 Å/second or less.

The third layer 75 serves as an electron blocking layer to block an overflow of remaining electrons passing through the first layer 71 and the second layer 73 or to reduce electron mobility. In addition, it may play a role of passivation of a V-pit included in a lower portion. The third layer 75 may be formed of an AlGaN layer having an Al composition in a range of 10 to 50%, or a superlattice layer of AlGaN/GaN, and a thickness thereof may be in a range of 100 Å to 500 Å, 100 Å to 350 Å, or 250 Å to 500 Å.

A fourth layer 81 may be grown at a highest growth temperature in the second conductivity type semiconductor region 85a, and in particular, it is grown by including hydrogen ($H_2$) as a carrier gas. The fourth layer 81 may be formed of p-type GaN, a doping concentration of Mg in the fourth layer 81 may be within a range of $1E19$ to $5E19/cm^3$, and a thickness thereof may be within a range of 300 Å to 500 Å, and further 350 Å to 500 Å.

A fifth layer 83 is a second conductive contact layer and may have a thickness of 50 Å to 150 Å and a doping concentration of Mg within a range of $1E20$ to $1E21/cm^3$. The fifth layer 83 may be formed of p-type GaN or p-type AlGaN.

The second conductivity type semiconductor region 85a according to this embodiment is for improving a hole injection efficiency, and in particular, improves a hole injection efficiency into the active region including the plurality of light emitting portions described with reference to FIGS. 1 through 7. The second conductivity type semiconductor region 85a according to this embodiment may also be applied to a light emitting device including only a blue light emitting portion 60b or only a green light emitting portion 60g.

Figure 13:
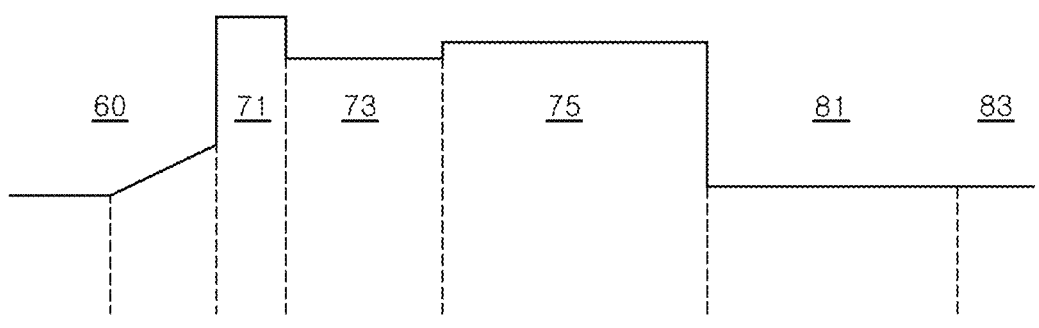
FIG. 13 is a schematic band diagram illustrating a second conductivity type semiconductor region according to an embodiment of the present disclosure.

FIG. 13 is a schematic band diagram illustrating the second conductivity type semiconductor region 85a according to an embodiment of the present disclosure.

Referring to FIG. 13, when the number of light emitting layers in an active region 60 increases, electrons and holes need to be efficiently combined in all well layers. FIG. 13 shows an example of a hole injection structure configured to realize an optimal carrier population density of electrons and holes in a well layer even when a total number of well layers is 10 or more.

A last barrier layer, which is a last layer of the active region 60, may be formed of a composition grading layer from a low Al composition state to a high Al composition state, and an Al composition may increase in a range of 1% to 30%. Each of the layers may be configured to have a profile in which an energy band of a conduction band is offset, as shown in FIG. 13.

For example, the first layer 71 may be formed of Al(Ga)N, and the second layer 73 may be formed of p-type AlINGaN or p-type AlGaN. The third layer 75 may be formed of p-type AlGaN, p-type AlGaN/GaN superlattice, or p-type AlInGaN, the fourth layer 81 is p-type GaN, and the fifth layer 83 may be formed of p-type GaN, and the fifth layer 83 may be formed of p++ GaN or high-concentration p-type AlGaN.

The first layer 71 may have a thickness of 10 Å to 30 Å, the second layer 73 may have a thickness of 100 Å to 250 Å, the 32 layer 75 may have a thickness of 100 Å to 350 Å, and the fourth layer 81 may have a thickness of 300 Å to 500 Å, and the fifth layer 83 may have a thickness of 50 Å to 150 Å. A total thickness of the first through fifth layers 71, 73, 75, 81, and 83 may be in a range of 500 Å to 1000 Å. Within this thickness range, the second conductivity type semiconductor region 85a may reduce absorption of light generated in the active region 60 and increase re-reflection to achieve high-efficiency optical characteristics, and furthermore, may have favorable electrical characteristics.

When the second conductivity type semiconductor region 85a is grown, a region adjacent to the active region 60 grows at a relatively low temperature to enable efficient hole generation and hole injection, and layers are grown at a relatively high growth temperature to fill V-pits and obtain a high-quality second conductivity type GaN layer. For example, the first layer 71 may be grown at a temperature of 750° C. to 900° C., the second layer 73 at a temperature of 700° C. to 850° C., the third layer 75 at a temperature of 850° C. to 965° C., the fourth layer 81 at a temperature of 900° C. to 980° C., and the fifth layer 83 at a temperature of 900° C. to 950° C., and specifically, the first to fifth layers may be grown at 865° C., 765° C., 895° C., 980° C., and 900° C., respectively.

In addition, regarding the doping of the p-type dopant in the second conductivity type semiconductor region 85a, for example, the doping of Mg, the first layer 71 directly adjacent to the active region may not be doped, and the second layer 73 may be doped with a high concentration. The third layer 75 may be partially doped with a low concentration or may be deposited without intentional doping. Meanwhile, a doping concentration of the fourth layer 81 is higher than that of the third layer 75 and lower than that of the fifth layer 83. A Mg doping concentration in the first layer 71 may be within a range of 1E18 to 1E19/cm$^3$, a Mg doping concentration in the second layer 73 may be within a range of 1E20 to 5E20/cm$^3$, a Mg doping concentration in the third layer 75 may be in a range of 1E18 to 5E19/cm$^3$, a Mg doping concentration in the fourth layer 81 may be in a range of 1E19 to 1E20/cm$^3$, and a Mg doping concentration in the fifth layer 83 may be in a range of 1E20 to 1E21/cm$^3$.

Figure 14A:
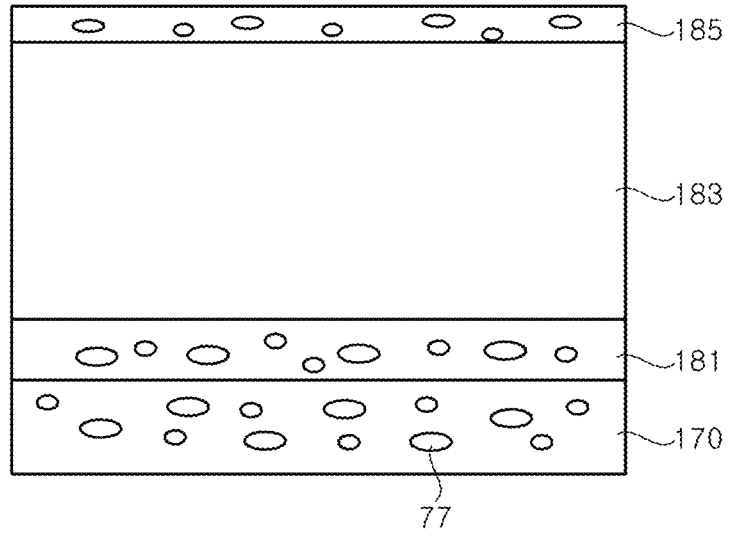
FIGS. 14A and 14B are schematic cross-sectional views illustrating a second conductivity type semiconductor region according to another exemplary embodiment of the present disclosure.
Figure 14B:
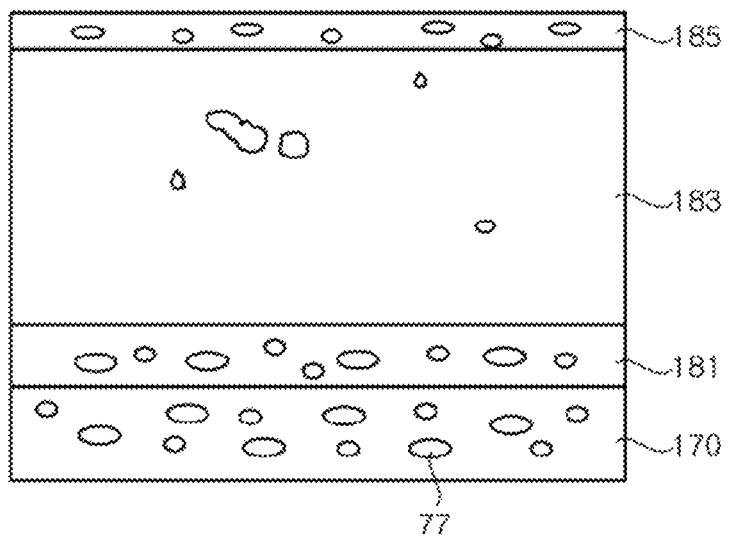

FIGS. 14A and 14B are schematic cross-sectional views illustrating a second conductivity type semiconductor region 85b according to another embodiment of the present disclosure.

Referring to FIGS. 14A and 14B, the second conductivity type semiconductor region 85b according to this embodiment may be used instead of the second conductivity type semiconductor region 85 of FIGS. 1 through 7. The second conductivity type semiconductor region 85b may include an electron blocking layer 170, a high concentration doping layer 181, a low concentration doping layer 183, and a contact layer 185.

The electron blocking layer 170 may be formed of p-type AlxInyGa1-x-yN (x, y≥0). An Al composition and an In composition in the electron blocking layer 170 may be, for example, about 1 to 25 atomic % and 0 to about 2 atomic %, respectively, with respect to an entire group 3 elements, and for example, may be formed with a thickness of about 25 nm to 50 nm. A Mg doping concentration in the electron blocking layer 170 may be within a range of 1E18 to 5E20/cm$^3$, and particularly includes a region having a doping concentration of 5E19/cm$^3$ or more.

The high-concentration doping layer 181 and the low-concentration doping layer 183 may be formed of p-type AlxInyGa1-x-yN (x, y≥0), and have an Al composition ratio smaller than that of the electron blocking layer 170. An Al composition and an In composition in the high-concentration doping layer 181 and the low-concentration doping layer 183 may be, for example, 0 to about 0.3 atomic % and 0 to about 0.5 atomic %, respectively, with respect to the entire group 3 elements, and may be formed of a p-type GaN layer. Herein, the high-concentration doping layer 181 means a layer in which the p-type dopant concentration is relatively high with respect to the low-concentration doping layer 183, and the low-concentration doping layer 183 means a layer in which the p-type dopant concentration is relatively low with respect to the high-concentration doping layer 181. Meanwhile, a lowest point of the Mg doping concentration in the low concentration doping layer 183 is less than 5E19/cm 3, and the Mg doping concentration in the low concentration doping layer 183 may vary. The high-concentration doping layer 181 includes a region in which the doping concentration of Mg is 5E19/cm$^3$ or higher.

The high-concentration doping layer 181 and the low-concentration doping layer 181 may be gallium nitride-based semiconductor layers having a same composition, but the inventive concepts are not necessarily limited thereto. A total thickness of the high-concentration doping layer 181 and the low-concentration doping layer 183 may be, for example, within a range of about 50 nm to about 200 nm. Meanwhile, the high-concentration doping layer 181 may have a thickness within a range of, for example, about 2 nm to about 50 nm. The low-concentration doping layer 183 may have a thickness of, for example, 180 nm or less.

The contact layer 185 may be formed of p-type AlxInyGa1-x-yN (x, y≥0), and has an Al composition ratio smaller than that of the electron blocking layer 170. An Al composition and an In composition in the contact layer 185 may be, for example, 0 to about 5 atomic % and 0 to about 30 atomic %, respectively, with respect to the entire group 3 elements, and may be formed of a p-type GaN layer. A thickness of the contact layer 185 may be, for example, in a range of about 3 nm to about 15 nm.

In this embodiment, the second conductivity type semiconductor region 85b includes Mg balls 77. The Mg balls 77 are formed in the second conductivity type semiconductor region 85b disposed between the active region 60 and a p-electrode. For example, at least one of the electron blocking layer 170, the high-concentration doping layer 181, and the contact layer 185 may include the Mg balls 77 therein. The Mg balls 77 in the electron blocking layer 170 may be disposed apart from the active region 60. The Mg balls 77 may be formed by doping a semiconductor layer with a doping concentration of Mg higher than an appropriate concentration, for example, at a concentration of about 5E19/cm$^3$ or higher. Furthermore, regions of the semiconductor layer around the Mg balls 77 formed close to the active region 60 may include Al, and an Al content thereof may be at least 0.05 atomic % or more, or even 1 atomic % or more.

At least two or more Mg balls 77 may have a curved boundary surface, may have an amorphous shape, and may have different sizes or shapes from one another. Accordingly, since the Mg balls 77 have different surface areas or cross-sectional circumferences from one another, a plurality of Mg balls may have a circular shape or an elliptical shape. Furthermore, concentrations of Mg in a plurality of regions where the Mg balls 77 are disposed may be different from one another. The Mg balls 77 may be spaced apart at various distances, and may have different resistivities from one another. In addition, densities of the Mg balls 77 may be different from one another in the plurality of regions where the Mg balls 77 are formed. In detail, based on a same area, densities of the Mg balls in a first region and a second region where the Mg balls are distributed may be different from each other. Accordingly, the second conductivity type semiconductor region 85b has various resistance densities, and thus, current flow may be improved.

Additionally, at least one Mg ball 77a may be formed by combining or connecting the plurality of Mg balls 77, and a connection portion may have a relatively concave shape. That is, a width of the connection portion may be smaller than that of the Mg ball. A connected Mg ball 77a may be formed in an upper region of a well layer of the active region 60 or at any position in the second conductivity type semiconductor region 85b.

The second conductivity type semiconductor region 85b may include the Mg balls 77 in a single region, or may include the Mg balls 77 in a plurality of regions in another embodiment. Thicknesses of regions including the Mg balls 77 may be different from one another. For example, in a region close to the active region 60, the Mg balls 77 may be formed over a thick region. For example, a thickness of a region where the Mg balls 77 are formed in the contact layer 185 is smaller than a thickness of a region where the Mg balls 77 are formed in the electron blocking layer 170 and the high-concentration doping layer 181. Based on a same width in a second direction perpendicular to a first direction, which is a growth direction of the semiconductor layer, contents of the Mg balls may be made different by differentiating thicknesses of the first region and the second region in the first direction. Accordingly, a resistance region in the second conductivity type semiconductor region 85b has a different thickness, and thus, current flow may be improved.

Meanwhile, a region composed of the electron blocking layer 170 and the high-concentration doping layer 181 may include a region in which an Al composition thereof changes, for example, a region in which the Al composition thereof increases or decreases, and thus, an Al composition peak point may be disposed in the electron blocking layer 170. In addition, the contact layer 185 may include a region in which an Al content thereof changes.

The Mg balls 77 have a relatively high resistivity compared to a surrounding semiconductor layer region, and block current in a vertical direction. Accordingly, current spreading may easily occur in the region where the Mg balls 77 are formed. Meanwhile, a ground region G without Mg balls 77 is disposed over a relatively wide thickness region between the regions where the Mg balls 77 are formed. For example, the low-concentration doping layer 183 is disposed between the contact layer 185 and the high-concentration doping layer 181. The ground region G may be thicker than a total thickness of the regions where the Mg balls 77 are formed. Since the ground region G does not include Mg balls that hinder the flow of current, current may easily pass therethrough. Alternatively, the ground region G may be dispersed in a form of fine-sized Mg particles smaller than Mg balls, and thus, current flow may not be hindered. A Mg doping concentration of the ground region G may include a region where the Mg doping concentration changes, and thus, current flow may be improved due to changing Mg doping concentrations even when the Mg balls are not included.

Figure 15A:
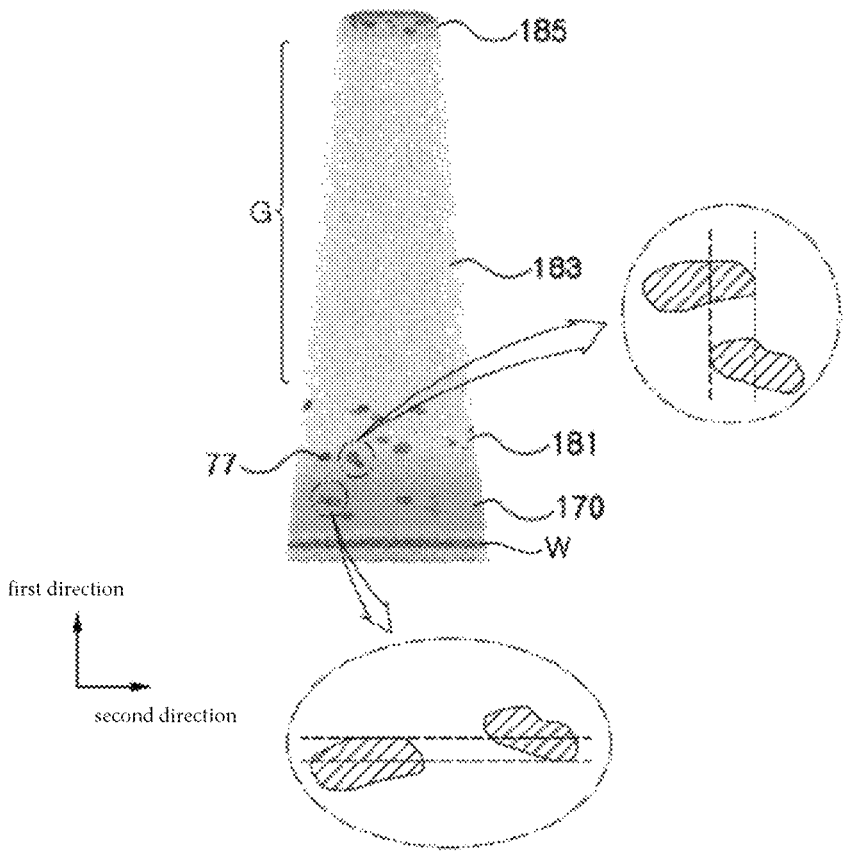
FIGS. 15A and 15B are images obtained using an atom probe.
Figure 15B:
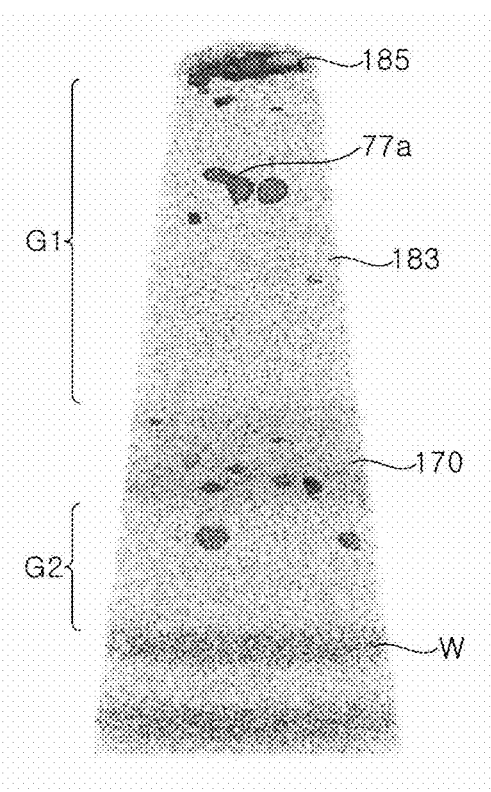
Figure 16:
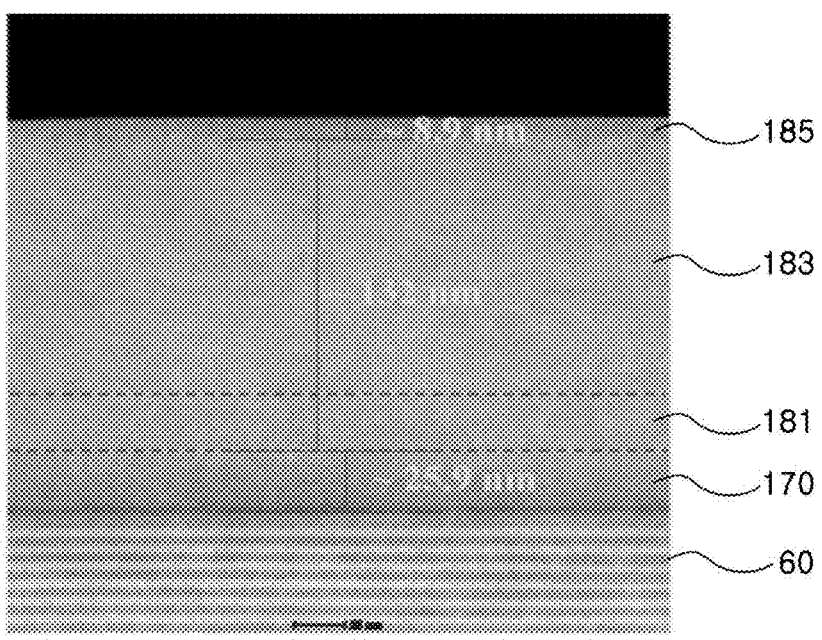
FIG. 16 is a TEM image showing a second conductivity type semiconductor region of a light emitting diode fabricated according to an embodiment.

The first conductivity type semiconductor layer including a superlattice layer and a multi-quantum well layer are formed on a substrate, and the second conductivity type semiconductor region 85b including the electron blocking layer 170, the high-concentration doping layer 181, the low-concentration doping layer 183, and the contact layer 185 are formed thereon as described with reference to FIGS. 14A and 14B, and then, atom probe and TEM analyses were performed. FIGS. 15A and 15B are images obtained using an atom probe, and FIG. 16 is a TEM image.

Referring to FIG. 15A, it can be observed that the Mg balls 77 are formed in the electron blocking layer 170, the high-concentration doping layer 181, and the contact layer 185. Referring to FIG. 16, although a boundary between the high-concentration doping layer 181 and the low-concentration doping layer 183 is not clear, the high-concentration doping layer 181 in which the Mg balls 77 are formed and the low-concentration doping layer not including the Mg balls can be distinguished through the atom probe.

Referring to FIG. 15B, the high-concentration doping layer 181 may be omitted. The low-concentration doping layer 183 may be disposed between the electron blocking layer 170 and the contact layer 185, and the Mg balls may be disposed in the low-concentration doping layer 183. Since the thickness of the contact layer 185 is smaller than those of the electron blocking layer 170 and the low-concentration doping layer 183, the Mg balls may be combined to form a Mg ball having a largest size in the semiconductor layer region. The Mg balls may be diffused from the electron blocking layer 170 toward the active region 60, and may be additionally disposed in a region G2 between a well layer w closest to the second conductivity type semiconductor layer and the electron blocking layer 170. The region G2 may have an Al content lower than that of the electron blocking layer 170, a band gap smaller than that of the electron blocking layer 170, a band gap larger than that of the well layer w, and may have at least one Mg ball. Accordingly, a hole injection efficiency into the well layer may be improved.

When a growth direction of the semiconductor layer is referred to as a first direction, and a direction perpendicular to the first direction is referred to as a second direction, the plurality of Mg balls may be arranged to overlap at least a portion of the first direction. Accordingly, a current spreading effect may be increased according to a depth of the semiconductor layer, that is, along a thickness direction. Alternatively, in another embodiment, the plurality of Mg balls may be arranged to overlap at least a portion of the second direction. Accordingly, holes may be injected into an entire region of the well layer by increasing the current spreading effect in a planar direction of the semiconductor layer.

Although Mg has been exemplarily described, the inventive concepts are not necessarily limited thereto, and any donor impurity ball is possible. For example, a carbon ball is possible.

The second conductivity type semiconductor region 85b according to this embodiment is for improving a hole injection efficiency, and particularly improves the hole injection efficiency into the active region including the plurality of light emitting portions. The second conductivity type semiconductor region 85b according to this embodiment may also be applied to a light emitting device including only the blue light emitting portion 60b or only the green light emitting portion 60g.

Figure 17:
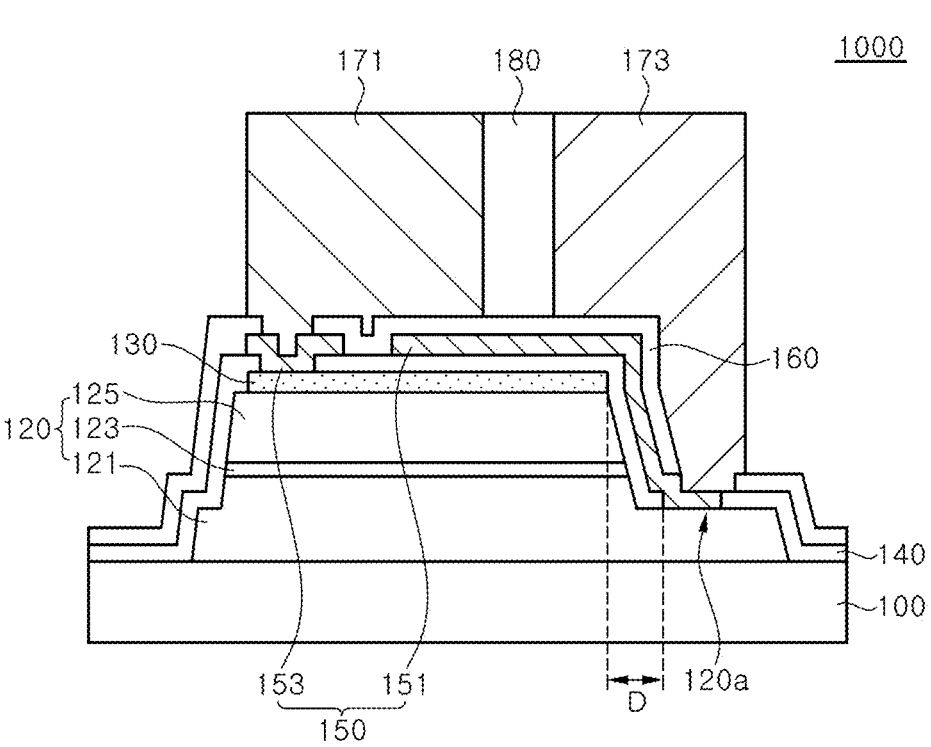
FIG. 17 is a schematic cross-sectional view illustrating a light emitting device according to an embodiment of the present disclosure.

FIG. 17 is a schematic cross-sectional view illustrating a light emitting device 1000 according to an embodiment of the present disclosure.

Referring to FIG. 17, the light emitting device 1000 according to this embodiment is obtained by adding an electrode structure to the light emitting device described in the previous embodiments. Specifically, the light emitting device 1000 includes a base 100, a light emitting device 120, an ohmic electrode 130, a first insulation layer 140, a pair of pad electrodes 150; 151 and 153, a second insulation layer 160, bump electrodes 171 and 173, and a filling layer 180.

Since the base 100 is same as the base 10 described above, a detailed description thereof will be omitted to avoid redundancy. In addition, the light emitting device 120 includes a first conductivity type semiconductor region 121, a light emitting region 123, and a second conductivity type semiconductor region 125 as the color device of the above-described embodiments, and includes a control portion although not shown in the drawing.

A portion of the first conductivity type semiconductor region 125 is exposed by etching the second conductivity type semiconductor region 125 and the light emitting region 123. An exposed surface of the first conductivity type semiconductor region 121 becomes a first conductivity type contact region 120a. Meanwhile, an upper surface of the second conductivity type semiconductor region 125 may serve as a second conductivity type semiconductor contact region. The ohmic electrode 130 may be disposed on the second conductivity type semiconductor region 125 to provide an ohmic contact.

The ohmic electrode 130 may be formed of a metal material (Al, Ti, Ni, Ag, Au, W, Sn, etc.) or a transparent conductive oxide (ITO, ZnO, AZO, IZO, etc.). The first insulation layer 140 may cover the ohmic electrode 130. The first insulation layer 140 covers a portion of the ohmic electrode 130 and may cover a side surface of a mesa and a portion of the first conductivity type contact region 120a by a distance D. The first insulation layer 140 may include $SiO_2$, $SiN_x$, $TiO_2$, $Al_2O_3$, and the like, and may include a distributed bragg reflector. The first insulation layer 140 may also cover a side surface of the first conductivity type semiconductor region 121 and an upper surface of the base 100.

A portion of the ohmic electrode 130 and a portion of the first conductivity type contact region 120a may be exposed without being covered by the first insulation layer 140, and the pad electrodes 150; 151 and 153 formed on the first insulation layer 140 may be electrically connected to the exposed ohmic electrode 130 and the second conductivity type contact region 120a.

The bump electrodes 171 and 173 are formed over the pad electrodes 150; 151 and 153 and may include metal materials such as Al, Ti, Ni, Ag, Au, W, Sn, and the like. The bump electrodes 171 and 173 may be electrically connected to the pad electrodes 150; 151 and 153 to transfer electricity supplied from a circuit board to the light emitting device 120.

Figure 18:
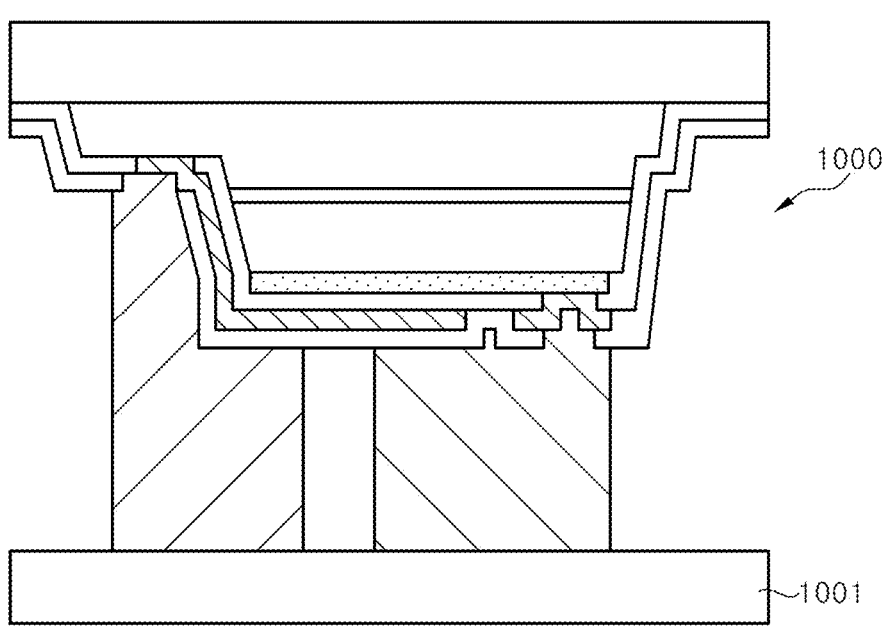
FIG. 18 is a schematic cross-sectional view illustrating a module according to an embodiment of the present disclosure.

The second insulation layer 160 may be further formed between the bump electrodes 171 and 173 and the pad electrodes 150; 151 and 153. The second insulation layer 160 may include $SiO_2$, $SiN_x$, $TiO_2$, $Al_2O_3$, and a distributed Bragg reflector. Although the bump electrodes 171 and 173 are shown in FIG. 17 as being disposed thereon, the light emitting device 1000 may be flip-mounted on a circuit board 1001 and electrically connected as shown in FIG. 18, light may be emitted to the outside through the first conductivity type semiconductor region 121 and the base 100.

Meanwhile, the light emitting region may be formed of a nitride semiconductor, and may emit light having peak wavelengths equal to or greater than the number of the pad electrodes 151 and 153.

Figure 19:
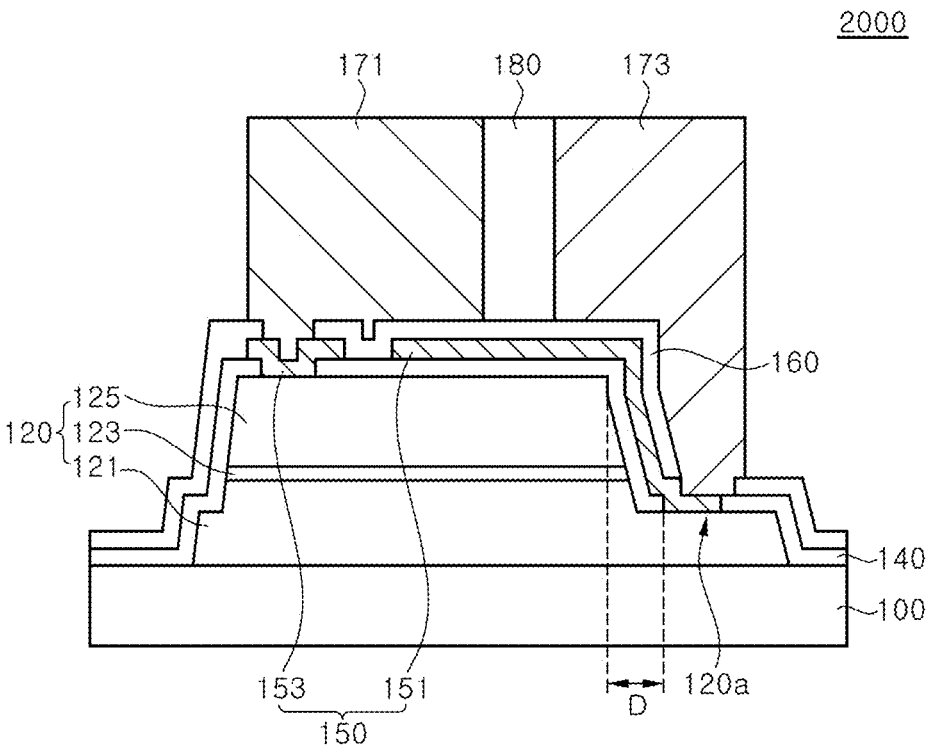
FIG. 19 is a schematic cross-sectional view illustrating a light emitting device according to another embodiment of the present disclosure.

FIG. 19 is a schematic cross-sectional view illustrating a light emitting device 2000 according to another exemplary embodiment of the present disclosure.

Referring to FIG. 19, the light emitting device 2000 according to this embodiment is substantially similar to the light emitting device 1000 described with reference to FIG. 17, except that the ohmic electrode 130 is omitted.

That is, in the light emitting device 2000, the electrode pad 153 formed on the insulation layer 140 without an additional ohmic electrode is in ohmic contact with the second conductivity type semiconductor region 125 to serve as an ohmic electrode. The light emitting device 2000 may also be flip-mounted on the circuit board 1001 as shown in FIG. 18.

Figure 20:
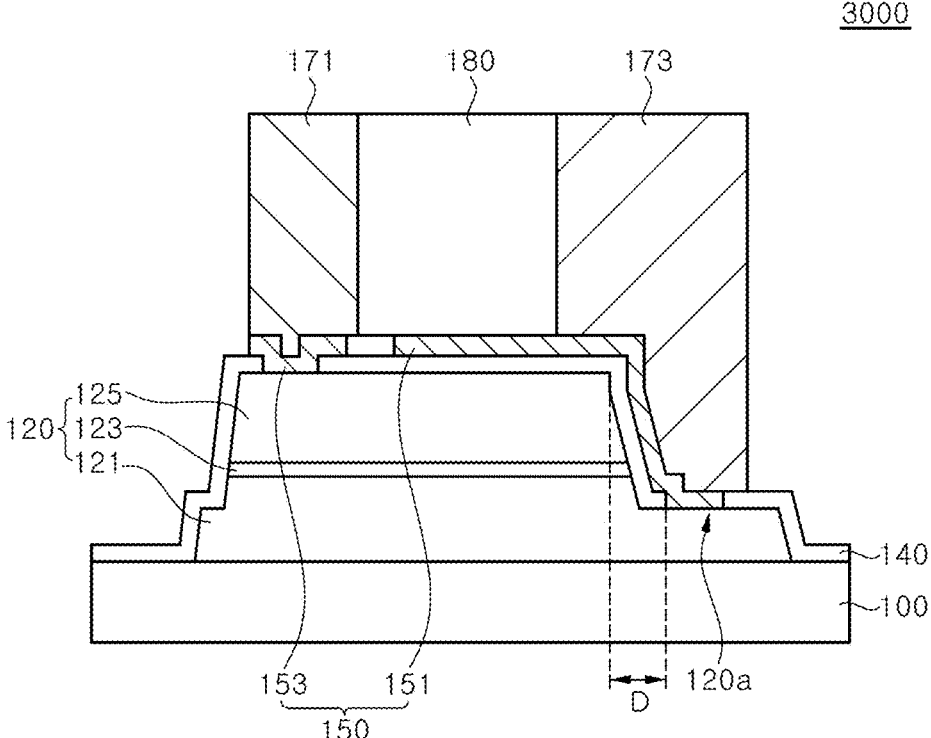
FIG. 20 is a schematic cross-sectional view illustrating a light emitting device according to another embodiment of the present disclosure.

FIG. 20 is a schematic cross-sectional view illustrating a light emitting device 3000 according to another exemplary embodiment of the present disclosure.

Referring to FIG. 20, the light emitting device 3000 according to this embodiment is substantially similar to the light emitting device 2000 described with reference to FIG. 19, except that the second insulation layer 160 is omitted. The insulation layer 140 and the pad electrodes 150; 151 and 153 may be disposed between bump electrodes 171 and 173 and the light emitting device 120, and the bump electrodes 171 and 173 may be formed directly on the pad electrodes 150; 151 and 153. As described with reference to FIG. 18, the light emitting device 3000 may be flip-mounted on the circuit board 1001, and light is emitted to the outside through the first conductivity type semiconductor region 121 and the base 100.

Figure 21:
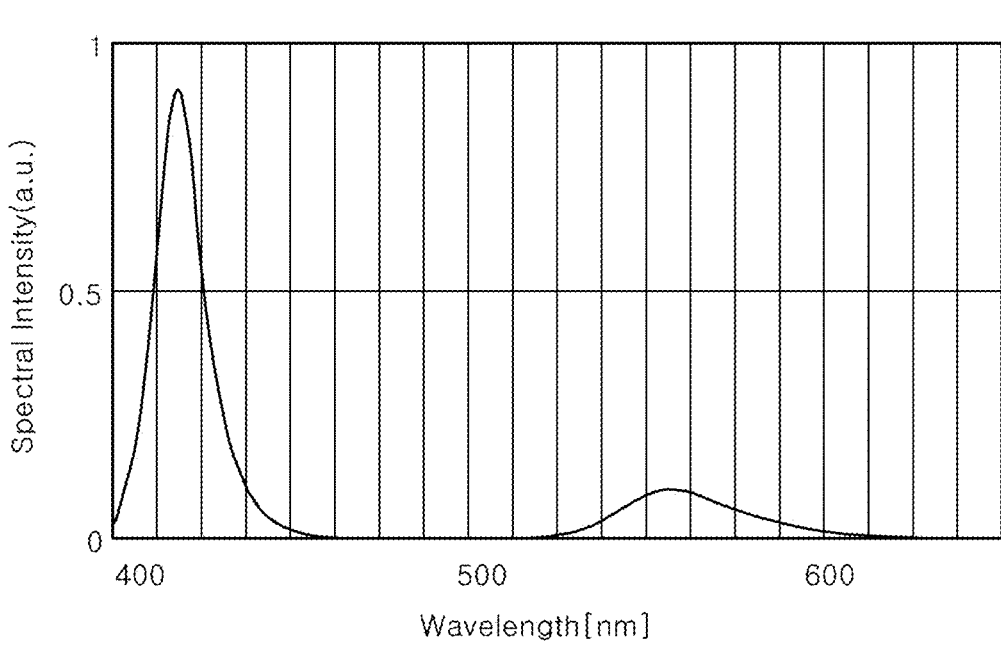
FIG. 21 is a graph showing a spectrum of a light emitting device according to an embodiment of the present disclosure.
Figure 22:
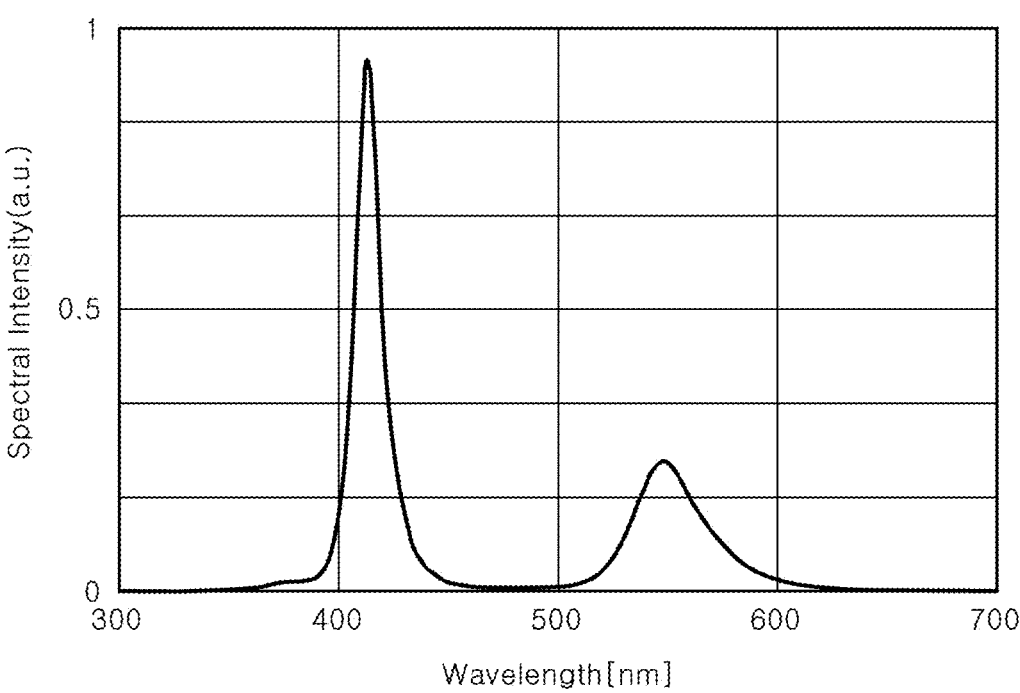
FIG. 22 is a graph showing a spectrum of a light emitting device according to an embodiment of the present disclosure.

FIGS. 21 and 22 are graphs showing spectra of light emitting devices according to some embodiments of the present disclosure. An intensity of a peak in a blue region may be greater than that of a peak in a longer wavelength region such as green, orange, or red, and desired visibility may be realized by adjusting the intensity by adjusting a number or a thickness of a light emitting portion.

In addition, the light emitting device may implement color coordinates corresponding to a range of CIE color coordinate values (x=0.205 to 0.495, y=0.19 to 0.45).

Under a low current density condition of less than 35 $mA/cm^2$, the intensity of blue light may be 1.1 to 1.6 times that of green or yellow light. Meanwhile, under a high current density condition of 35 $mA/cm^2$ or more, the intensity of green or yellow light may be 0.25 to 0.8 times, and specifically, 0.5 to 0.7 times that of blue light.

Referring to FIG. 22, a first peak may be in a range of 410 nm to 435 nm, and a second peak may be in a range of 535 nm to 555 nm.

Alternatively, an emission intensity of the second peak may be 0.45 to 0.75 times that of the first peak. Alternatively, an integrated area of the emission intensity of the first peak may be 0.3 to 0.75 times that of the emission intensity of the second peak. Due to a difference in light emission intensity, it is possible to implement white light in a semiconductor itself. A spectral profile near the first peak may have an asymmetric shape based on a peak point. Alternatively, a spectral profile near the second peak may have an asymmetrical shape based on the peak point.

Figure 23A:
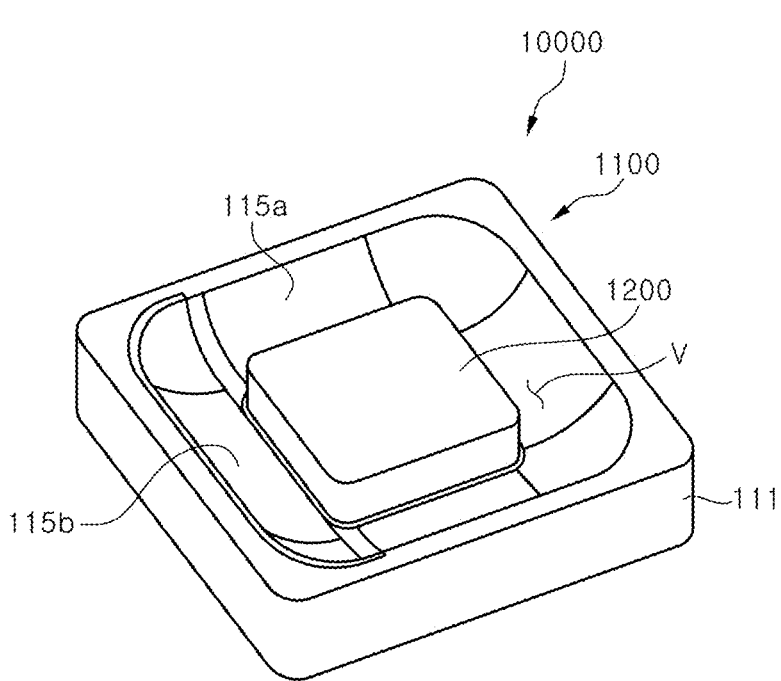
FIG. 23A is a perspective view illustrating a light emitting diode package to which a light emitting diode according to an embodiment of the present disclosure is applied.
Figure 23B:
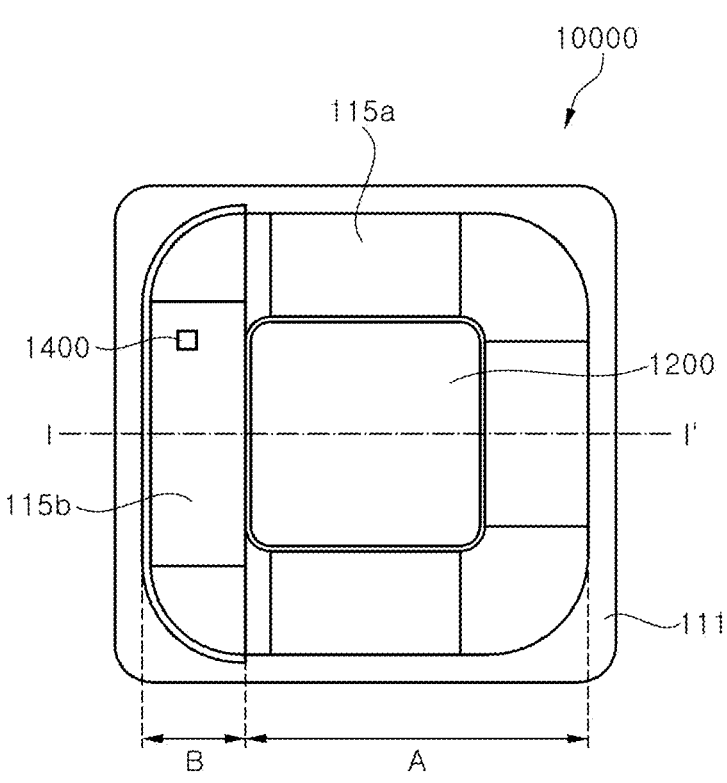
FIG. 23B is a plan view of FIG. 23A.
Figure 23C:
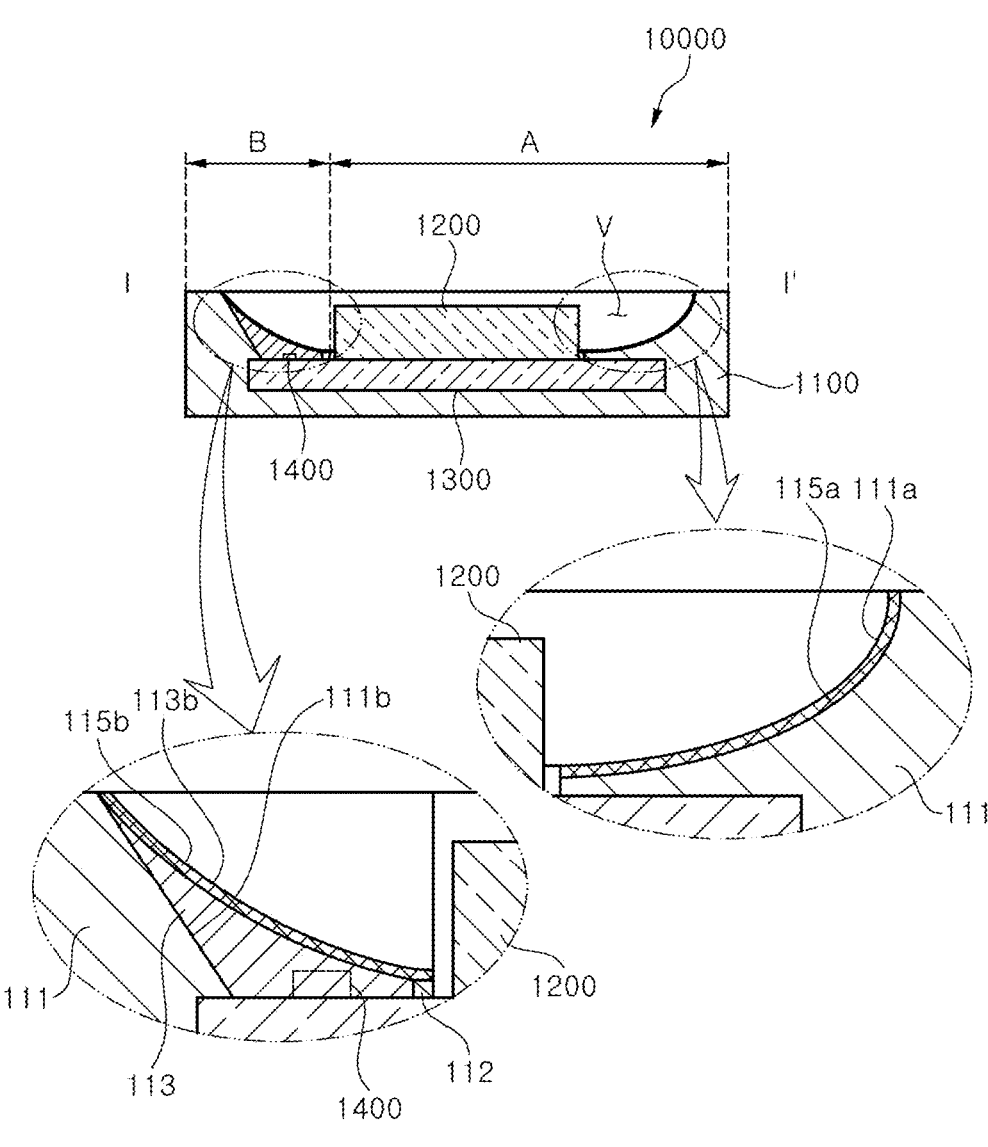
FIG. 23C is a cross-sectional view taken along line I-I' of FIG. 23B.

FIG. 23A is a perspective view illustrating a light emitting diode package to which a light emitting device according to an embodiment of the present disclosure is applied, FIG. 23B is a plan view of FIG. 23A, and FIG. 23C is a cross-sectional view taken along line I-I' of FIG. 23B.

Referring to FIGS. 23A, 23B, and 23C, a package 10000 includes a housing 1100, a light emitting device 1200, a lead frame 1300, and a Zener diode 1400.

The housing 1100, in this embodiment, includes a body portion 111, a cover portion 113, and a coating layer 115. As shown in the drawings, the body portion 111 may have a substantially quadrangular shape on a planar surface, and may surround the lead frame 1300 to support the lead frame 1300. The housing 1100 may have a cavity V having one surface open therein, and the light emitting device 1200 may be disposed in the cavity V.

Herein, a depth of the cavity V may be greater than a height of the light emitting device 1200. In this case, as shown in FIGS. 23B and 23C, the body portion 111 may be divided into a region A and a region B. The region A may be a region where the light emitting device 1200 is mounted, and the region B may be a region where the Zener diode 1400 is mounted.

Looking at the region A of the body portion 111, an inclined surface of the cavity V surrounding the light emitting device 1200 may have a same inclined surface with respect to the light emitting device 1200. In this case, a first body inclined surface 111a formed in the region A may be formed as a curved surface, as shown in FIG. 23C, and may be formed such that a slope of the curved surface becomes steeper toward an upper portion thereof.

The first body inclined surface 111a formed in the region A is formed in the cavities V of three surfaces of the light emitting device 1200 except for one surface of the light emitting device 1200. In this case, an inner side surface of the first body inclined surface 111a may be disposed adjacent to a position where the light emitting diode chip 1200 is mounted. Accordingly, light emitted from the light emitting device 1200 may be reflected from the first body inclined surface 111a and emitted upward of the package 10000.

In addition, in this embodiment, a second body inclined surface 111b formed in the region B may be a linear cross-sectional shape. However, when the first body inclined surface 111a is formed as the inclined surface, it is not limited to the linear cross-sectional shape, and may be a curved line.

In this case, as it can be seen in FIG. 23B, a width of the region B in a vertical direction may be greater than that of the region A in the vertical direction. Although this will be described later, this is to secure a space in which the cover portion 113 can be formed to cover the second body inclined surface 111b.

As shown in FIG. 23C, the cover portion 113 is disposed to cover the second body inclined surface 111b formed in the region B. The cover portion 113 is formed to have a thickness configured to cover the Zener diode 1400 disposed in the region B, and is formed to a degree not to exceed a stepped portion 112. In addition, as shown in the drawings, the cover portion 113 may have a cover inclined surface 113b formed as a gentle inclined surface. The cover inclined surface 113b may be formed as a curved surface, and may be formed such that a slope thereof becomes gentle from an upper portion to a lower portion thereof.

Herein, the cover portion 113 is described as being formed not to exceed the stepped portion 112, without being limited thereto, and a portion of the cover portion 113 may be formed beyond the stepped portion 612 to the position where the light emitting diode chip 1200 is mounted, if necessary. That is, the cover portion 113 may be formed to cover the second body inclined surface 111b and the Zener diode 1400 by using a viscous material including a reflective material. In this case, the reflective material may be $TiO_2$, $Al_2O_3$, and the like.

As the cover portion 113 is formed in the region B, the cover inclined surface 113b formed in the cavity V of the package 10000 may be formed in a shape similar to that of the first body inclined surface 111a. Accordingly, all surfaces of reflection surfaces formed in the cavity V may be substantially same with respect to the light emitting device 1200.

The coating layer 115 is formed to cover the first body inclined surface 111a and the cover inclined surface 113b by using a coating material including a reflective material. In this case, the reflective material may be $TiO_2$, $Al_2O_3$, and the like. That is, the coating layer 115 may be formed to cover an entire region except for the light emitting device 1200 in the cavity V of the package 10000. To this end, the coating layer 115 may be formed on the first body inclined surface 111a and the cover inclined surface 113b by using various methods such as spraying, dispensing, jetting, film attaching, sputtering, e-beam deposition, and. the like, which may be performed above the cavity V of the package 10000, with an upper portion of the light emitting device 1200 masked. Accordingly, a first coating inclined surface 115a may be formed in the region A of the cavity V of the package 10000, and a second coating inclined surface 115b may be formed in the region B.

Figure 24:
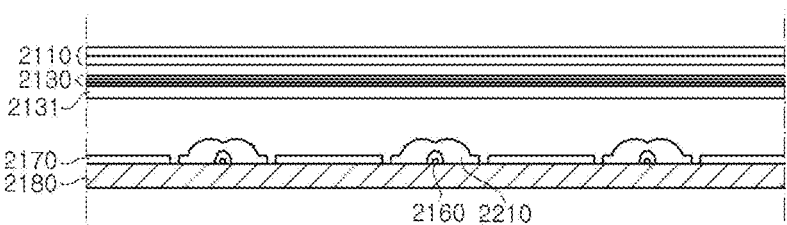
FIG. 24 is a cross-sectional view illustrating a display apparatus to which a light emitting device according to an embodiment of the present disclosure is applied.

FIG. 24 is a cross-sectional view illustrating a display apparatus to which a light emitting device according to an embodiment of the present disclosure is applied.

The display apparatus of this embodiment includes a display panel 2110, a backlight unit providing light to the display panel 2110, and a panel guide supporting a lower edge of the display panel 2110.

The display panel 2110 is not particularly limited, and may be, for example, a liquid crystal display panel including a liquid crystal layer. A gate driving PCB for supplying a driving signal to a gate line may be further disposed at an edge of the display panel 2110. Herein, the gate driving PCB may not be configured in an additional PCB, but may be formed on a thin film transistor substrate.

The backlight unit includes a light source module including at least one substrate and a plurality of light emitting devices 2160. Furthermore, the backlight unit may further include a base substrate 2180, a reflection unit 2170, a diffusion plate 2131, and optical sheets 2130.

The base substrate 2180 may open upward and accommodate the substrate, the light emitting device 2160, the reflection sheet 2170, the diffusion plate 2131, and the optical sheets 2130. In addition, the base substrate 2180 may be coupled with the panel guide. The base substrate 2180 may be disposed under the reflection unit 2170, and the light emitting device 2160 may be disposed surrounded by the reflection unit 2170. However, without being limited thereto, the light emitting device 2160 may be disposed on the reflection unit 2170 when a reflective material is coated on a surface of the base substrate 2180. In addition, a plurality of substrates may be formed, and the plurality of substrates may be disposed in a form flush with one another, without limited thereto, and the backlight unit may include a single substrate.

The light emitting device 2160 may include the light emitting device according to the above-described embodiments of the present disclosure. The light emitting devices 2160 may be regularly arranged in a predetermined pattern on the substrate. The light emitting devices 2160 may be arranged in a square shape, or in another form, may be staggered not to overlap adjacent light emitting devices 2160.

In addition, a light guide 2210 may be disposed on each of the light emitting devices 2160, thereby improving uniformity of light emitted from the plurality of light emitting devices 2160. The light guide 2210 may be one of materials such as Si, a lens, and a resin including a phosphor. The light guide 2210 may have an upper surface parallel to the base substrate 2180, or may have a convex curved surface.

The diffusion plate 2131 and the optical sheets 2130 are disposed on the light emitting device 2160. Light emitted from the light emitting device 2160 may be supplied to the display panel 2110 in a form of a surface light source via the diffusion plate 2131 and the optical sheets 2130.

As such, the light emitting device according to the embodiments of the present disclosure may be applied to a direct-type display apparatus as this embodiment.

Figure 25:
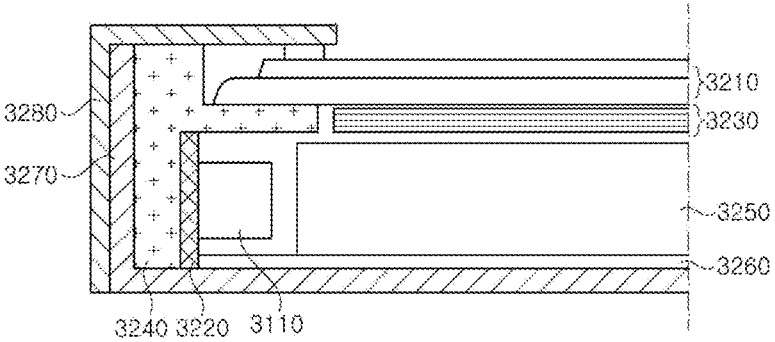
FIG. 25 is a cross-sectional view illustrating a display apparatus to which a light emitting device according to another embodiment of the present disclosure is applied.

FIG. 25 is a cross-sectional view illustrating a display apparatus to which a light emitting device according to another embodiment of the present disclosure is applied.

The display apparatus having a backlight unit according to this embodiment includes a display panel 3210 on which an image is displayed, and a backlight unit disposed on a rear surface of the display panel 3210 to emit light. Furthermore, the display apparatus includes a frame 240 supporting the display panel 3210 and accommodating the backlight unit, and covers 3240 and 3280 surrounding the display panel 3210.

The display panel 3210 is not particularly limited, and may be, for example, a liquid crystal display panel including a liquid crystal layer. A gate driving PCB for supplying a driving signal to a gate line may be further disposed at an edge of the display panel 3210. Herein, the gate driving PCB may not be configured in an additional PCB, but may be formed on a thin film transistor substrate. The display panel 3210 is secured by the covers 3240 and 3280 disposed under and over the display panel 3210, and the cover 3280 disposed under the display panel 3210 may be coupled to the backlight unit.

The backlight unit providing light to the display panel 3210 includes a lower cover 3270 having a partially opened upper surface, a light source module disposed on an inner side of the lower cover 3270, and a light guide plate 3250 disposed in parallel with the light source module to convert point light into surface light. In addition, the backlight unit of this embodiment may further include optical sheets 3230 disposed on the light guide plate 3250 to diffuse and condense light, and a reflection sheet 3260 disposed under the light guide plate 3250 to reflect light proceeding in a lower direction of the light guide plate 3250 toward the display panel 3210.

The light source module includes a substrate 3220 and a plurality of light emitting devices 3110 spaced apart from one another at regular intervals on one surface of the substrate 3220. The substrate 3220 is not limited as long as it supports the light emitting device 3110 and is electrically connected to the light emitting device 3110, and may be, for example, a printed circuit board. The light emitting device 3110 may include at least one light emitting device according to the above-described embodiments of the present disclosure. Light emitted from the light source module is incident on the light guide plate 3250 and supplied to the display panel 3210 through the optical sheets 3230. Through the light guide plate 3250 and the optical sheets 3230, point light sources emitted from the light emitting devices 3110 may be transformed into surface light sources.

As such, the light emitting device according to embodiments of the present disclosure may be applied to an edge type display apparatus as this embodiment.

Figure 26:
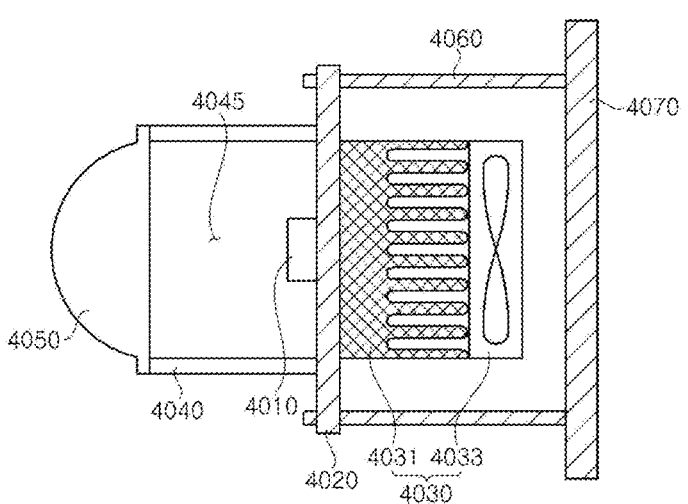
FIG. 26 is a cross-sectional view illustrating a lighting apparatus to which a light emitting device according to another embodiment of the present disclosure is applied.

FIG. 26 is a cross-sectional view illustrating a lighting apparatus to which a light emitting device according to another embodiment of the present disclosure is applied.

Referring to FIG. 26, the lighting apparatus includes a lamp body 4070, a substrate 4020, a light emitting device 4010, and a cover lens 4050. Furthermore, the lighting apparatus may further include a heat dissipation unit 4030, a support rack 4060, and a connection member 4040.

The substrate 4020 is secured by the support rack 4060 and disposed apart over the lamp body 4070. The substrate 4020 is not limited as long as it can support the light emitting device 4010, and may be, for example, a substrate having a conductive pattern such as a printed circuit board. The light emitting device 4010 may be disposed on the substrate 4020, and supported and secured by the substrate 4020. In addition, the light emitting device 4010 may be electrically connected to an external power source through the conductive pattern of the substrate 4020. In addition, the light emitting device 4010 may include at least one light emitting device according to the above-described embodiments of the present disclosure.

The cover lens 4050 is disposed on a path along which light emitted from the light emitting device 4010 moves. For example, as shown in the drawings, the cover lens 4050 may be disposed apart from the light emitting device 4010 by the connection member 4040, and disposed in a direction in which light emitted from the light emitting device 4010 is to be provided. A viewing angle and/or color of light emitted from the lighting apparatus to the outside may be adjusted by the cover lens 4050. Meanwhile, the connection member 4040 secures the cover lens 4050 to the substrate 4020, and may serve as a light guide by being disposed to surround the light emitting device 4010 and providing a light emitting path 4045. In this case, the connection member 4040 may be formed of a light reflective material or coated with a light reflective material. Meanwhile, the heat dissipation unit 4030 may include a heat dissipation fin 4031 and/or a heat dissipation fan 4033, and may emit heat generated when the light emitting device 4010 is driven to the outside, but is not limited thereto, and it may not include a component related to heat dissipation.

As such, the light emitting device according to embodiments of the present disclosure may be applied to a lighting apparatus or a headlamp for a vehicle as in this embodiment.

FIGS. 27A, 27B, and 27C are a schematic cross-sectional view, a plan view, and a circuit diagram illustrating a display apparatus to which a light emitting device according to another embodiment of the present disclosure is applied, respectively. FIG. 27A is a partial cross-sectional view of the display apparatus, FIG. 27B is a plan view of a backlight unit, and FIG. 27C is a circuit diagram of the backlight unit.

Referring to FIGS. 27A, 22B, and 22C, the display apparatus of this embodiment includes a display panel 5270 and a backlight unit providing light to the display panel 5270.

The display panel 5270 is not particularly limited and may be, for example, a liquid crystal display panel including a liquid crystal layer. A gate driving PCB for supplying a driving signal to a gate line may be further disposed at an edge of the display panel 5270. Herein, the gate driving PCB may not be formed on an additional PCB, but may be formed on a thin film transistor substrate.

The backlight unit may include a circuit board 5100, a reflection unit 5110, a light emitting device 5130, a dam portion 5150, a molding member 5170, a diffusion film 5190, a blue light transmittance (BLT) film, a quantum dot (QD) film 5230, and a brightness enhancement film 5250.

The backlight unit includes a circuit board 5100 and a light source module including a plurality of light emitting devices 5130 disposed on the circuit board 5100. One light source module may be used as the backlight unit, or a plurality of light source modules may be arranged on a plane and used as the backlight unit.

The reflection unit 5110 may be disposed on a surface of the circuit board 5100 as shown in FIG. 27A. The reflection unit 5110 may be provided as a reflection sheet or coated on the circuit board 5100. The reflection unit 5110 may surround the light emitting devices 5130 by being formed around a region where the light emitting devices 5130 are mounted. However, the inventive concepts are not limited thereto, and the light emitting devices 5130 may be disposed on the reflection unit 5110.

The circuit board 5100 has circuits for supplying power to the light emitting devices 5130. The light emitting devices 5130 may be connected in series, parallel, or series-parallel through circuits formed on the circuit board 5100. An electrical connection structure of the light emitting devices 5130 will be described later with reference to FIG. 27C.

The light emitting device 5130 includes at least one light emitting device of the present disclosure described above, and detailed description thereof is omitted.

The dam portion 5150 is formed on the circuit board 5100. The dam portion 5150 divides a region on the circuit board 5100 into a plurality of blocks, as shown in FIG. 23B. A plurality of light emitting devices 5130 may be disposed in each of the blocks. For example, in this embodiment, four light emitting devices 5130 are disposed in each of the blocks. However, the inventive concepts are not limited thereto, and more or fewer light emitting devices 5130 than four may be disposed in each of the blocks.

The dam portion 5150 may include a reflective material that reflects light generated from the light emitting devices 5130 and may be formed of, for example, white silicone.

The molding member 5170 fills blocks partitioned by the dam portion 5150. The molding member 5170 may be formed of transparent silicone. The dam portion 5150 and the molding member 5170 may include silicone of a same series, and may be formed of, for example, phenyl or methyl. Since the dam portion 5150 and the molding member 5170 include the same type of silicone, a bonding force between the molding member 5170 and the dam portion 5150 may be improved.

The diffusion film 5190 is disposed on the molding member 5170. The diffusion film 5190 diffuses light generated from the light emitting devices 5130 to evenly diffuse light. The diffusion film 5190 may adhere to the molding member 5170, without being limited thereto, and may be spaced apart from the molding member 5170. The diffusion film 5190 may be formed of one sheet, or may be formed of a plurality of sheets as shown in FIG. 27A.

The BLT film 5210 and the QD film 5230 may be disposed on the diffusion film 5190. The QD film 5230 includes quantum dots that convert light emitted from the light emitting devices 5130, for example, blue light, into green light and red light.

The BLT film 5210 transmits light emitted from the light emitting devices 5130, for example, blue light, and reflects green light and red light generated from the QD film 5230. Accordingly, it is possible to prevent green light and red light generated from the QD film 5230 from being lost while proceeding toward the circuit board 5100.

Meanwhile, the brightness enhancement film 5250 is disposed on the QD film 5230 to improve a brightness of light proceeding to the display panel 5270. The brightness enhancement film 5250 may include lower and upper brightness enhancement films, and may further include a dual brightness enhancement film (DBEF).

As shown in FIG. 27B, the light emitting devices 5130 are disposed in blocks partitioned by the dam portion 5150. The light emitting devices 5130 in a same block may be spaced apart from one another at an equal interval. In addition, the light emitting devices 5130 in adjacent blocks may also be spaced apart at a similar interval. As shown in FIG. 27B, the light emitting devices in one block may be arranged in a tilted shape with respect to a quadrangular shaped block.

Meanwhile, as shown in FIG. 27C, the light emitting devices 5130 arranged in each block B1 to Bn may be connected in series to one another. In addition, anodes of the light emitting devices in first to nth blocks may be connected to one another, and cathodes thereof may be spaced apart from one another. For example, anodes of the light emitting devices in a first block B1 and anodes of the light emitting devices in a second block B2 are connected to one another, and cathodes of the light emitting devices in the first block B1 and cathodes of the light emitting devices of the second block B2 are electrically spaced apart from one another. Accordingly, the light emitting devices 5130 may be independently driven in units of blocks.

According to this embodiment, since the light emitting devices 5130 are independently driven in block units, and for example, a black region may be implemented by turning off the light emitting devices 5130. Therefore, a contrast may be implemented more clearly, and a power consumption may be reduced compared to a conventional LCD display in which a backlight light source is always turned on. Furthermore, by using the QD film, vivid colors may be implemented.

As such, the light emitting device according to embodiments of the present disclosure may be applied to a mini LED display apparatus as this embodiment.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

We claim:
1. A light emitting device, comprising:
a first conductivity type semiconductor region;
a second conductivity type semiconductor region; and
a light emitting region disposed between the first conductivity type semiconductor region and the second conductivity type semiconductor region,
wherein the second conductivity type semiconductor region includes a first region, second region, and a third region, wherein the second region is disposed between the first region and the third region and has a greater thickness than a thickness of each of the first region and the third region, and wherein an amount of Magnesium (Mg) balls of the second region is lower than an amount of Mg Balls of the first region and the third region.

2. The light emitting device of claim 1, wherein at least one of the first region, the second region, or the third region has a Mg doping concentration of $5E19/cm^3$ or more.

3. The light emitting device of claim 2, wherein at least one of the first region, the second region, or the third region-contains Aluminium (Al).

4. The light emitting device of claim 3, wherein a content of the Al is 0.05 atomic % or more and 30 atomic % or less with respect to Group 3 elements.

5. The light emitting device of claim 1, wherein at least portions of the Mg balls have a curved boundary surface.

6. The light emitting device of claim 1, wherein the Mg balls have various amorphous shapes.

7. The light emitting device of claim 1, wherein the Mg balls have different concentrations from one another.

8. The light emitting device of claim 1, wherein the Mg balls have different resistivities from one another.

9. The light emitting device of claim 1, wherein the first region, the second region, and the third region have different Mg ball densities from one another.

10. The light emitting device of claim 1, wherein: the second conductivity type semiconductor region includes an electron blocking layer, a high-concentration doping layer, a low-concentration doping layer, and a contact layer, and the Mg balls are distributed in the electron blocking layer, the high-concentration doping layer, and the contact layer.

11. The light emitting device of claim 10, wherein the low-concentration doping layer is substantially free of the Mg balls.

12. The light emitting device of claim 11, wherein a thickness of the low-concentration doping layer is greater than a total thickness of the electron blocking layer, the high-concentration doping layer, and the contact layer.

13. The light emitting device of claim 11, wherein the low-concentration doping layer has a doping profile that changes according to a thickness, and a lowest doping concentration is less than $5E19/cm^3$.

14. The light emitting device of claim 13, wherein the low-concentration doping layer has an Al content of about 0.5 atomic % or less or is free of the Al.

15. The light emitting device of claim 10, wherein a region in which a Al composition decreases as a distance from the light emitting region increases is included in the electron blocking layer and the high-concentration doping layer.

16. The light emitting device of claim 10, wherein a point having a peak Al content in the second conductivity type semiconductor region is positioned in the electron blocking layer.

17. The light emitting device of claim 10, wherein the Mg balls in the electron blocking layer are spaced apart from the light emitting region.

18. The light emitting device of claim 1, wherein the light emitting region includes a first light emitting portion configured to emit blue light and a second light emitting portion configured to emit green or blue light.

* * * * *